US012765213B2

(12) United States Patent
Jang et al.

(10) Patent No.: US 12,765,213 B2
(45) Date of Patent: Oct. 13, 2026

(54) LIGHT EMITTING DISPLAY APPARATUS INCLUDING SUBPIXEL WITH TWO LIGHT EMISSION PORTIONS

(71) Applicant: LG Display Co., Ltd., Seoul (KR)

(72) Inventors: Jihyang Jang, Paju-si (KR); Jintae Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 254 days.

(21) Appl. No.: 18/514,927

(22) Filed: Nov. 20, 2023

(65) Prior Publication Data

US 2024/0090298 A1 Mar. 14, 2024

Related U.S. Application Data

(62) Division of application No. 17/122,696, filed on Dec. 15, 2020, now Pat. No. 11,864,444.

(30) Foreign Application Priority Data

Dec. 17, 2019 (KR) ........................ 10-2019-0169151

(51) Int. Cl.
*H01L 27/32* (2006.01)
*H10K 59/122* (2023.01)
(Continued)

(52) U.S. Cl.
CPC ........... *H10K 59/38* (2023.02); *H10K 59/122* (2023.02); *H10K 59/131* (2023.02); *H10K 59/353* (2023.02); *H10K 59/80515* (2023.02); *H10K 59/80521* (2023.02); *H10K 59/12* (2023.02); *H10K 59/87* (2023.02); *H10K 59/873* (2023.02);
(Continued)

(58) Field of Classification Search
CPC ...................................................... H10K 59/38
See application file for complete search history.

(56) References Cited

U.S. PATENT DOCUMENTS

| | | | | |
|---|---|---|---|---|
| 2005/0116615 A1* | 6/2005 | Matsumoto | H10K 59/351 | |
| | | | 313/500 | |
| 2009/0206733 A1* | 8/2009 | Hwang | H10K 50/854 | |
| | | | 445/24 | |

(Continued)

FOREIGN PATENT DOCUMENTS

| | | | | |
|---|---|---|---|---|
| CN | 107079559 A | | 8/2017 | |
| CN | 109976054 A | * | 7/2019 | G02F 1/134309 |

(Continued)

*Primary Examiner* — Peter Bradford

(74) *Attorney, Agent, or Firm* — Birch, Stewart, Kolasch & Birch, LLP

(57) ABSTRACT

A light emitting display apparatus can include a substrate having a unit pixel area; and a red subpixel, a white subpixel, a blue subpixel and a green subpixel disposed in the unit pixel area, the white subpixel having a light emission portion and a non-light emission portion, in which the light emission portion of the white subpixel includes a first light emission portion and a second light emission portion spatially spaced apart from each other. Also, the first light emission portion and the second light emission portion are configured to have different sizes from each other, and the first light emission portion and the second light emission portion of the white subpixel have light extraction structures different from each other.

20 Claims, 17 Drawing Sheets

(51) Int. Cl.

| | |
|---|---|
| ***H10K 59/131*** | (2023.01) |
| ***H10K 59/35*** | (2023.01) |
| ***H10K 59/38*** | (2023.01) |
| ***H10K 59/80*** | (2023.01) |
| *H10K 59/12* | (2023.01) |

(52) U.S. Cl.

CPC ......... *H10K 59/877* (2023.02); *H10K 59/879* (2023.02); *H10K 59/8793* (2023.02)

(56) References Cited

U.S. PATENT DOCUMENTS

| | | | | |
|---|---|---|---|---|
| 2012/0075278 | A1 | 3/2012 | Hara et al. | |
| 2015/0311261 | A1* | 10/2015 | Choi | H10K 59/1213 257/40 |
| 2015/0332628 | A1 | 11/2015 | Ren et al. | |
| 2015/0380466 | A1* | 12/2015 | Koo | H10K 59/124 438/70 |
| 2017/0062769 | A1* | 3/2017 | Kim | H10K 59/124 |
| 2017/0062770 | A1* | 3/2017 | Jang | H10K 50/11 |
| 2017/0125738 | A1* | 5/2017 | Kim | H10K 59/877 |
| 2018/0197929 | A1 | 7/2018 | Cho et al. | |
| 2018/0246363 | A1 | 8/2018 | Nemati et al. | |
| 2019/0096976 | A1* | 3/2019 | Jang | H10K 59/38 |
| 2019/0348624 | A1* | 11/2019 | Kim | H10K 50/11 |
| 2020/0227669 | A1* | 7/2020 | Guo | H10K 71/621 |

FOREIGN PATENT DOCUMENTS

| | | | |
|---|---|---|---|
| JP | 2012-69436 | A | 4/2012 |
| JP | 2016-76327 | A | 5/2016 |
| JP | 2018-37391 | A | 3/2018 |
| KR | 10-2013-0030598 | A | 3/2013 |
| KR | 10-2013-0060476 | A | 6/2013 |
| KR | 10-2018-0093179 | A | 8/2016 |
| KR | 10-2017-0027267 | A | 3/2017 |
| KR | 10-2017-0038061 | A | 4/2017 |
| KR | 10-2017-0052467 | A | 5/2017 |
| KR | 10-2017-0054654 | A | 5/2017 |
| KR | 10-2018-0002099 | A | 1/2018 |

* cited by examiner

LIGHT EMITTING DISPLAY APPARATUS INCLUDING SUBPIXEL WITH TWO LIGHT EMISSION PORTIONS

CROSS-REFERENCE TO RELATED APPLICATIONS

This application is a Divisional Application of U.S. application Ser. No. 17/122,696, filed on Dec. 15, 2020 (now U.S. Pat. No. 11,864,444 issued on Jan. 2, 2024), which claims priority to Korean Patent Application No. 10-2019-0169151 filed in the Republic of Korea on Dec. 17, 2019, the entire contents of all these applications are hereby expressly incorporated by reference into the present application.

BACKGROUND

Technical Field

The present disclosure relates to a light emitting display apparatus.

Description of the Related Art

A light emitting display apparatus is a self-light emitting display apparatus, and can be manufactured at a lightweight and slim size as it does not need a separate light source unlike a liquid crystal display (LCD) apparatus. Also, the light emitting display apparatus has good characteristics in view of power consumption due to low voltage driving and has good characteristics for color realization, a response speed, a viewing angle, and a contrast ratio, and thus attracts attention as the next-generation display apparatus.

The light emitting display apparatus displays an image through light emission of a light emitting device layer that includes a light emitting device interposed between two electrodes. For example, light generated in accordance with the light emission of the light emitting device is emitted to the outside through an electrode, a substrate, etc.

Recently, a light emitting display apparatus in which a white opening is added to a unit pixel having red, green and blue openings has been suggested.

Although the light emitting display apparatus that includes the white opening can improve luminance and a color temperature of a display image through the white opening, a trade off relation is formed between the luminance of a pure color such as red, green and blue and the luminance of a white color. For example, if the luminance and the color temperature of the white opening are increased, efficiency in the red and green openings can be reduced, whereby total performance of the light emitting display apparatus can be deteriorated.

SUMMARY

Accordingly, the present disclosure is directed to providing a display apparatus that substantially obviates one or more problems due to limitations and disadvantages of the related art.

A light emitting display apparatus according to the background art can have problems and limitations as follows. Some of the light emitted from a light emitting device is not emitted to the outside due to the total reflection on an interface between the light emitting device and an electrode and/or an interface between a substrate and an air layer, whereby light extraction efficiency is reduced. For example, in a general light emitting display apparatus, light of 80% of light emitted from the light emitting device may not be emitted (or extracted) to the outside but trapped in the light emitting device, and light of 20% can only be extracted to the outside. In order to improve light extraction efficiency of the light emitting display apparatus, a light emitting display apparatus in which a fine structure, for example, a microlens or uneven pattern is applied to an opening (or light emitting portion) has been suggested.

A light emitting display apparatus in which a fine structure is applied to the opening can generate a difference in a luminance increase rate between wavelength ranges in a white spectrum. For this reason, a difference in an efficiency increase rate among red, green and blue can occur, whereby luminance and a color temperature of a display image can be reduced.

Accordingly, an aspect of the present disclosure is to provide a light emitting display apparatus in which luminance and a color temperature of a display image can be improved.

Additional advantages and features of the disclosure will be set forth in part in the description which follows and in part will become apparent to those having ordinary skill in the art upon examination of the following or can be learned from practice of the disclosure. The objectives and other advantages of the disclosure can be realized and attained by the structure particularly pointed out in the written description and claims hereof as well as the appended drawings.

To achieve these and other aspects of the inventive concepts as embodied and broadly described, a light emitting display apparatus comprises a substrate including a subpixel area having a non-light emission portion, a first light emission portion and a second light emission portion; a driving transistor disposed in the non-light emission portion of the subpixel area; an overcoat layer disposed on the substrate to overlay the driving transistor; first and second anode electrodes disposed to be spaced apart from each other on the overcoat layer of each of the first light emission portion and the second light emission portion and commonly connected to the driving transistor; a self-light emitting device on the first anode electrode and the second anode electrode; and a second electrode on the self-light emitting device, wherein the first light emission portion of the subpixel area and the second light emission portion of the subpixel area have light extraction structures different from each other.

In another aspect of the present disclosure, a light emitting display apparatus comprises a substrate having a unit pixel area; and a red subpixel, a white subpixel, a blue subpixel and a green subpixel disposed in the unit pixel area, the white subpixel having a light emission portion and a non-light emission portion, wherein the light emission portion of the white subpixel can include a first light emission portion and a second light emission portion spatially spaced apart from each other, and wherein the first light emission portion and the second light emission portion have light extraction structures different from each other.

In the light emitting display apparatus according to the present disclosure, luminance and a color temperature of a display image can be improved.

In addition to the effects of the present disclosure as mentioned above, additional advantages and features of the present disclosure will be clearly understood by those skilled in the art from the above description of the present disclosure.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure.

DETAILED DESCRIPTION OF THE DISCLOSURE

Figure 1:
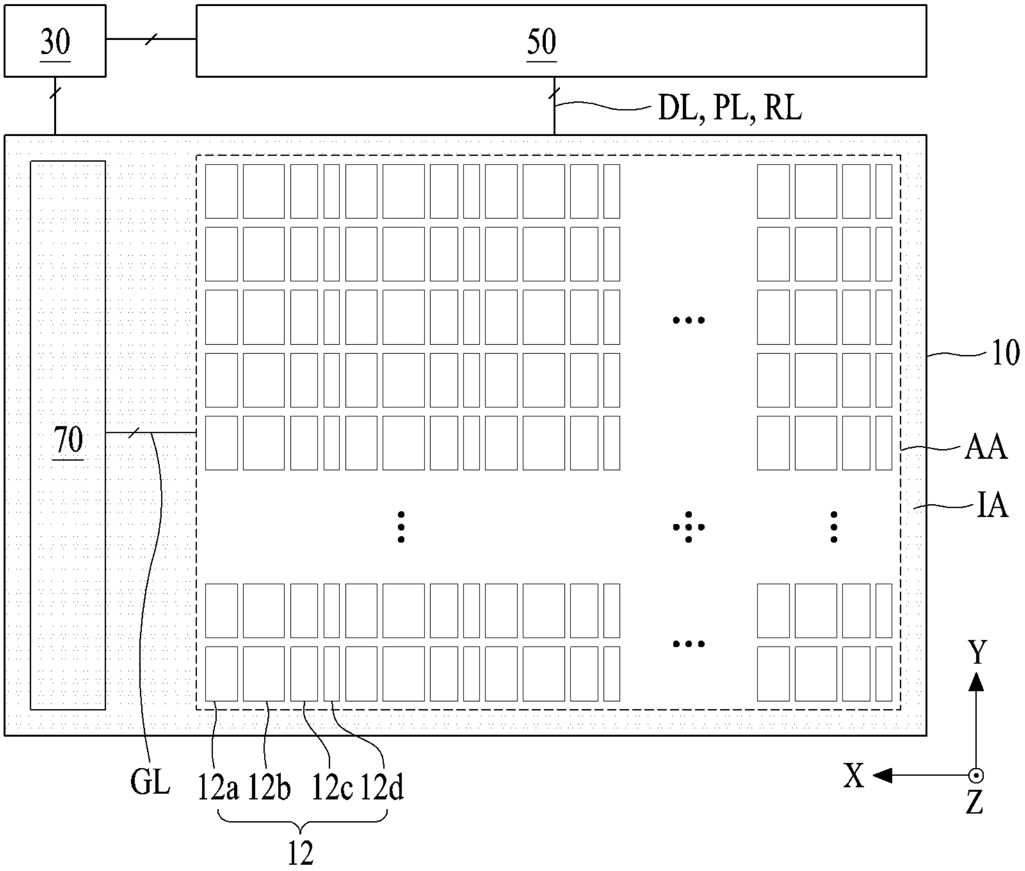
FIG. 1 is a schematic view illustrating a light emitting display apparatus according to one or more embodiments of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure can, however, be embodied in different forms and should not be construed as limited to the embodiments set forth herein. Rather, these embodiments are provided so that this disclosure will be thorough and complete, and will fully convey the scope of the present disclosure to those skilled in the art. Furthermore, the present disclosure is only defined by the scopes of the appended claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known technology is determined to unnecessarily obscure the important point of the present disclosure, the detailed description will be omitted.

In a case where 'comprise', 'have', and 'include' described in the present specification are used, another part can be added unless 'only-' is used. The terms of a singular form can include plural forms unless referred to the contrary.

In construing an element, the element is construed as including an error range although there is no explicit description.

In describing a positional relationship, for example, when a position relation between two parts is described as 'on-', 'over-', 'under-', and 'next-', one or more other parts can be disposed between the two parts unless 'just' or 'direct' is used.

In describing a time relationship, for example, when the temporal order is described as 'after-', 'subsequent-', 'next-', and 'before-', a case which is not continuous can be included unless 'just' or 'direct' is used.

It will be understood that, although the terms "first," "second," and the like can be used herein to describe various elements, these elements should not be limited by these terms and may not define any order. These terms are only used to distinguish one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure can be partially or overall coupled to or combined with each other, and can be variously inter-operated with each other and driven technically as those skilled in the art can sufficiently understand. The embodiments of the present disclosure can be carried out independently from each other, or can be carried out together in a co-dependent relationship.

Hereinafter, exemplary embodiments of a light emitting display apparatus according to the present disclosure will be described in detail with reference to the accompanying drawings. In adding reference numerals to elements in the drawings, although the same elements are illustrated in other drawings, like reference numerals can refer to like elements. Also, for convenience of description, a scale of each of elements illustrated in the accompanying drawings differs from a real scale, and thus, is not limited to a scale illustrated in the drawings.

FIG. 1 is a schematic view illustrating a light emitting display apparatus according to one or more embodiments of the present disclosure. All the components of the light emitting display apparatus according to all embodiments of the present disclosure are operatively coupled and configured.

Referring to FIG. 1, the light emitting display apparatus according to one embodiment of the present disclosure can include a display panel 10, a control circuit 30, a data driving circuit 50, and a gate driving circuit 70.

The display panel 10 can include a display area AA (or active area) defined on a substrate, and a non-display area IA (or inactive area) surrounding the display area AA.

The display area AA can include a plurality of subpixels 12*a*, 12*b*, 12*c* and 12*d* (12) disposed in an area defined by m number of gate lines GL and n number of data lines DL, where each of m and n can be a positive number such as a positive integer.

Each of the n number of gate lines GL can longitudinally be extended along a first direction X, and can be spaced apart from another gate line along a second direction Y crossing the first direction X. For example, each of the n number gate lines GL can include first and second gate lines.

Each of the m number of data lines DL can longitudinally be extended along the second direction Y, and can be spaced apart from another data line along the first direction X.

The display area AA can further include a plurality of pixel driving voltage lines PL and a plurality of reference voltage lines RL, which are disposed in parallel with the data lines DL. Each of the n number gate lines GL can include intersection portions that cross each of the m number of data lines DL, the plurality of pixel driving voltage lines P L and the plurality of reference voltage lines RL. The intersection portion of each of the n number of gate lines GL can include at least one slit or opening for minimizing an overlap area with the other lines.

Each of the plurality of subpixels 12*a*, 12*b* and 12*c* and 12*d* displays a color image corresponding to a gate signal supplied from the gate line GL adjacent thereto and a data voltage supplied from the data line DL adjacent thereto.

Each of the plurality of subpixels 12*a*, 12*b* and 12*c* and 12*d* can be arranged adjacent to each other along the length direction X of the gate line GL. For example, each of the plurality of subpixels 12*a*, 12*b* and 12*c* and 12*d* can include a short side parallel with the length direction X of the gate line GL and a long side parallel with the length direction Y of the data line DL. In this case, elements of the gate driving circuit 70 directly embedded or integrated in an edge portion of one side and/or the other side of the substrate can be simplified.

Each of the plurality of subpixels 12*a*, 12*b* and 12*c* and 12*d* according to another example can be disposed to adjacent to each other along the length direction Y of the data line DL. For example, each of the plurality of subpixels 12*a*, 12*b* and 12*c* and 12*d* can include a long side parallel with the length direction X of the gate line GL and a short side parallel with the length direction Y of the data line DL. In this case, the number of the gate lines GL connected to the gate driving circuit 70 having a relatively simple circuit configuration is increased but the number of the data lines DL connected to the data driving circuit 50 having a relatively complicated circuit configuration can be reduced, whereby the elements of the data driving circuit 50 can be simplified. Particularly, when a demultiplexing circuit can be disposed (or implemented) between the data driving circuit 50 and the data lines DL, the elements of the data driving circuit 50 can be more simplified.

Each of the plurality of subpixels 12*a*, 12*b* and 12*c* and 12*d* can include a pixel circuit disposed in a circuit area (or non-light emitting portion) of a subpixel area, and a light emitting device layer disposed in an opening area (or light emitting portion) of the subpixel area and electrically connected to the pixel circuit.

The pixel circuit can include at least two transistors (or thin-film transistors) and at least one capacitor.

The light emitting device layer can include a self-light emitting device that self-emits light by means of a data signal supplied from the pixel circuit to display an image.

Each of the plurality of subpixels 12*a*, 12*b* and 12*c* and 12*d* can be defined as a minimum unit area where light is actually emitted. In this case, at least four pixels adjacent to each other can constitute one unit pixel 12 for displaying a color image.

One unit pixel 12 according to one embodiment can include first to fourth subpixels 12*a*, 12*b*, 12*c* and 12*d* arranged adjacent to each other along the length direction of the gate line GL. For example, the first subpixel 12*a* can be a red subpixel or a first color subpixel, the second subpixel 12*b* can be a white subpixel or a second color subpixel, the third subpixel 12*c* can be a blue subpixel or a third color subpixel, and the fourth subpixel 12*d* can be a green subpixel or a fourth color subpixel.

The light emitting device layers respectively disposed in the first to fourth subpixels 12*a*, 12*b* and 12*c* and 12*d* can individually emit light of different colors or can commonly emit white light.

According to one embodiment, when the light emitting device layers of the first to fourth subpixels 12*a*, 12*b* and 12*c* and 12*d* commonly emit white light, the first to fourth subpixels 12*a*, 12*b* and 12*c* and 12*d* can respectively include different color filters (or wavelength conversion members) that convert white light into light of different colors. In this case, the second subpixel 12*b* according to one embodiment may not include a color filter. At least a portion of the second subpixel 12*b* according to one embodiment can include the same color filter as any one of the first, third and fourth subpixels 12*a*, 12*c* and 12*d*.

The control circuit 30 can generate a data signal per pixel corresponding to each of the plurality of subpixels 12*a*, 12*b*, 12*c* and 12*d* based on an image signal. The control circuit 30 according to one embodiment can extract white pixel data based on image signals, for example, red input data, green input data and blue input data of each unit pixel 12, respectively calculate red pixel data, green pixel data and blue pixel data by reflecting offset data based on the extracted white pixel data in the red input data, the green input data and the blue input data, align the calculated red, green, blue and white pixel data to be suitable for a pixel arrangement structure and supply the aligned data to the data driving circuit 50. For example, the control circuit 30 can convert the red, green and blue input data to four red, green, blue and white colored data in accordance with a data conversion method disclosed in the Korean Patent Publication No. 10-2013-0060476 or 10-2013-0030598, and the contents of these publications are incorporated by reference into the present application.

The control circuit 30 can drive the data driving circuit 50 and the gate driving circuit 70 in a display mode or a sensing mode. The control circuit 30 can generate each of data control signal and gate control signal for driving each of the data driving circuit 50 and the gate driving circuit 70 in the display mode or the sensing mode based on a timing synchronization signal, provide the data control signal to the data driving circuit 50, and provide the gate control signal to the gate driving circuit 70. For example, the sensing mode (or external compensation driving) can be performed for a blank period of a frame set in real time or periodically during a test process before a product of the light emitting display apparatus is launched, during initial driving of the display panel 10, during power on of the light emitting display apparatus, during power off of the light emitting display apparatus, or during power off after long time driving of the display panel 10.

The control circuit 30 stores sensing data per pixel provided from the data driving circuit 50 in a memory circuit in accordance with the sensing mode. The control circuit 30 can compensate for pixel data to be supplied to each of the subpixels 12*a*, 12*b*, 12*c* and 12*d* based on the sensing data stored in the memory circuit during the display mode and provide the compensated data to the data driving circuit 50. For example, the sensing data per pixel can include sequential change information of each of the light emitting device and a driving transistor. Therefore, the control circuit 30 can sense a characteristic value (for example, threshold voltage or mobility) of the driving transistor disposed in each of the subpixels 12*a*, 12*b*, 12*c* and 12*d* in the sensing mode, and can minimize or prevent picture quality deterioration caused by deviation in the characteristic value of the driving transistor in the plurality of subpixels by compensating for the pixel data to be supplied to each of the subpixels 12*a*, 12*b*, 12*c* and 12*d* based on the characteristic value. Since the sensing mode of the light emitting display apparatus is already known in the art by the applicant of the present disclosure, its detailed description will be omitted. For example, the light emitting display apparatus according to the present disclosure can sense the characteristic value of the driving transistor disposed in each of the subpixels 12*a*, 12*b*, 12*c* and 12*d* through the sensing mode disclosed in the Korean Patent Publication No. 10-2016-0093179, 10-2017-0054654, or 10-2018-0002099, and the contents of these publications are incorporated by reference into the present application.

The data driving circuit 50 can individually be connected to each of the m number of data lines DL which are provided in the display panel 10. The data driving circuit 50 can receive a data signal per pixel and a data control signal which are supplied from the control circuit 30 and can receive a plurality of reference gamma voltages which are supplied from a power circuit.

The data driving circuit 50 can convert a digital type data signal per pixel to an analog type data voltage per pixel by using the data control signal and the plurality of reference gamma voltages in the display mode, supply the converted data voltage per pixel to the corresponding data line DL, generate a reference voltage synchronized with the data voltage and supply the generated reference voltage to the plurality of reference voltage lines RL.

The data driving circuit 50 can convert a digital type sensing data signal to a sensing data voltage based on the data control signal and the plurality of reference gamma voltages in the sensing mode, supply the converted sensing data voltage to the corresponding subpixels 12*a*, 12*b*, 12*c* and 12*d* through the corresponding data line DL, sense the characteristic value of the driving transistor disposed in the corresponding subpixels 12*a*, 12*b*, 12*c* and 12*d* through each of the plurality of reference voltage lines RL, and supply the sensing data per pixel to the control circuit 30. For example, the data driving circuit 50 can sequentially sense the first to fourth subpixels 12*a*, 12*b*, 12*c* and 12*d*, which constitute the unit pixel 12.

The gate driving circuit 70 can individually be connected to each of the n number of gate lines GL which are provided in the display panel 10. The gate driving circuit 70 can generate gate signals in a predetermined sequence based on the gate control signal which is supplied from the control circuit 30 and supply the generated gate signals to the corresponding gate line GL.

The gate driving circuit 70 according to one embodiment can be integrated in one edge or both edges of the substrate through a manufacturing process of a thin-film transistor and be connected to the plurality of gate lines GL in one-to-one correspondence manner. The gate driving circuit 70 according to another embodiment can be configured as an integrated circuit and mounted at the substrate or a flexible circuit film and connected to the plurality of gate lines GL in one-to-one correspondence manner.

Meanwhile, when the data driving circuit 50 is driven in only the display mode without the sensing mode, the plurality of reference voltage lines RL disposed in the display area AA can be omitted, and the data driving circuit 50 can supply only the data voltage to the corresponding data line DL.

Figure 2:
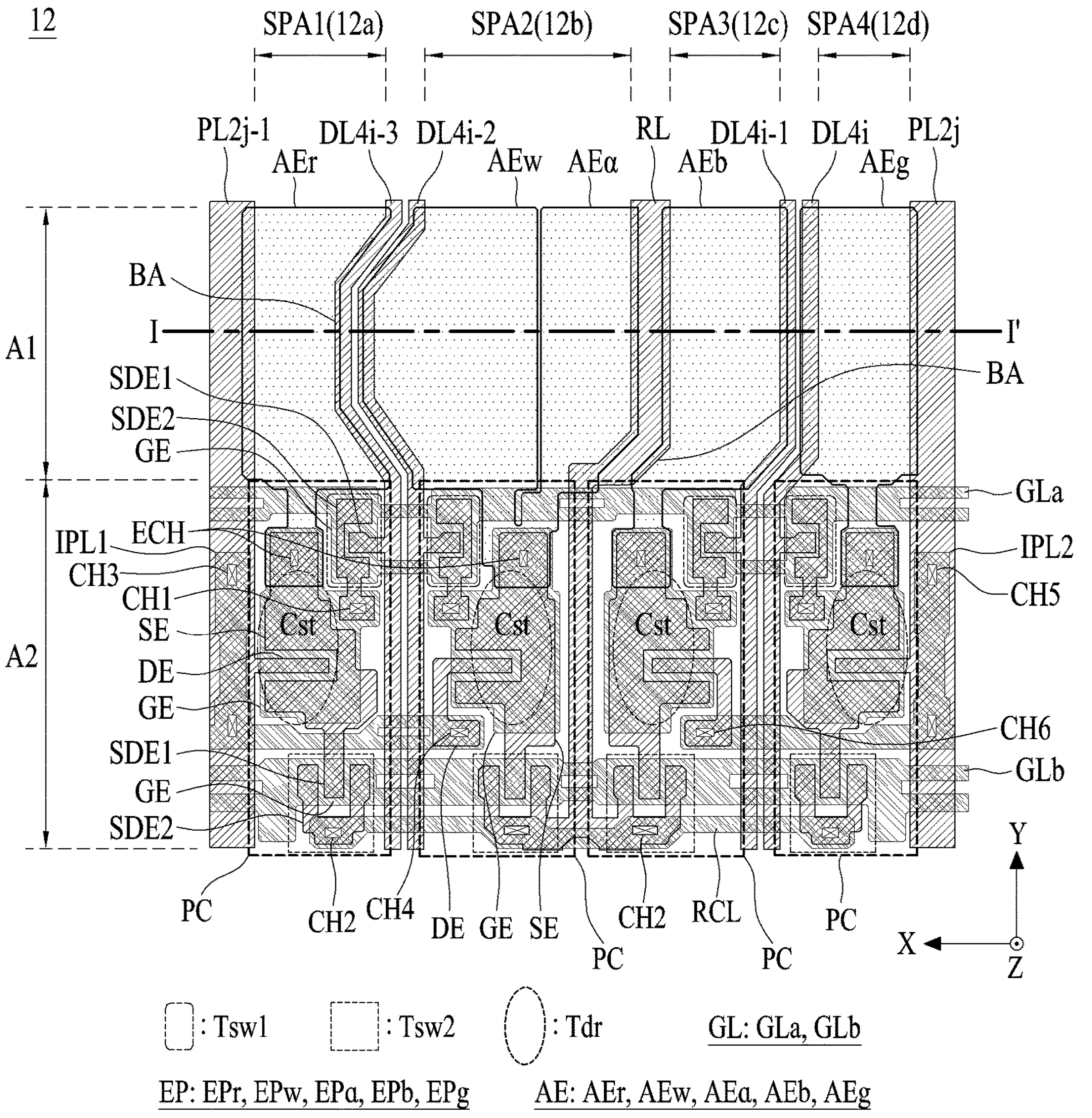
FIG. 2 is a view illustrating an arrangement structure of a unit pixel according to one embodiment shown in FIG. 1.
Figure 3:
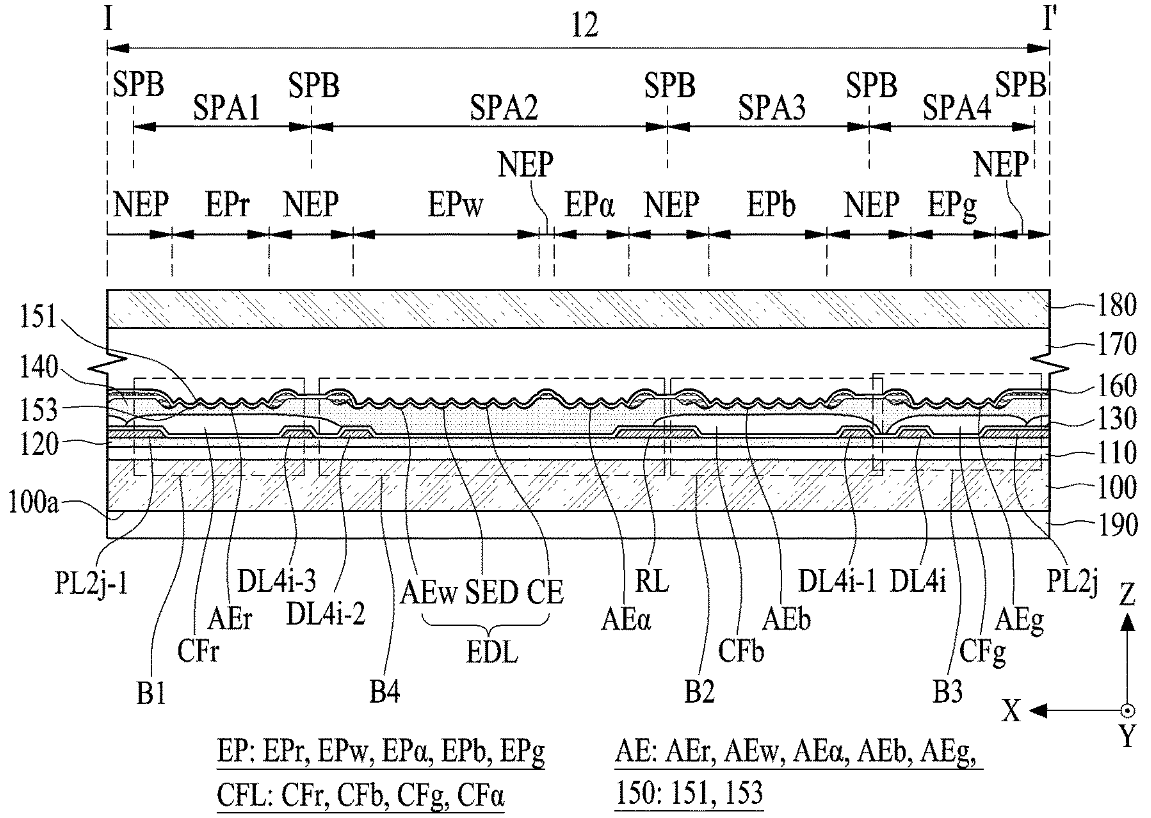
FIG. 3 is a cross-sectional view taken along line I-I' shown in FIG. 2.

FIG. 2 is a view illustrating an arrangement structure of a unit pixel according to one embodiment shown in FIG. 1, and FIG. 3 is a cross-sectional view taken along line I-I' shown in FIG. 2.

Referring to FIGS. 2 and 3, the unit pixel 12 according to one embodiment of the present disclosure can include a first to fourth subpixel areas SPA1 to SPA4 having different sizes to each other. In the following description, a size of the subpixel area can be understood as an area of the subpixel area.

Each of the first to fourth subpixel areas SPA1 to SPA4 can be defined by a pixel driving voltage line PL, four data lines DL4*i*-3, DL4*i*-2, DL4*i*-1 and DL4*i*, and the reference voltage line RL.

The first subpixel area SPA1 can be disposed between the (4i-3)th (i is a natural number) data line DL4*i*-3 of the plurality of data lines and the (2j-1)th (j is a natural number) pixel driving voltage line PL2*j*-1 of the plurality of pixel driving voltage lines PL. For example, the (4*i*-3)th data line DL4*i*-3 can be a first color data line or a red data line. The (2j-1)th pixel driving voltage line PL2*j*-1 can be an odd-numbered pixel driving voltage line of the plurality of pixel driving voltage lines PL.

The second subpixel area SPA2 can be disposed between the (4i-2)th data line DL4*i*-2 of the plurality of data lines and the reference voltage line RL. For example, the (4i-2)th data line DL4*i*-2 can be a second color data line or a white data line. The (4i-3)th data line DL4*i*-3 and the (4i-2)th data line DL4*i*-2 can be disposed adjacent to each other and parallel to each other.

The third subpixel area SPA3 can be disposed between the (4i-1)th data line DL4*i*-1 of the plurality of data lines and the reference voltage line RL. For example, the (4i-1)th data line DL4*i*-1 can be a third color data line or a blue data line.

The fourth subpixel area SPA4 can be disposed between the (4i)th data line DL4*i* of the plurality of data lines and the (2j)th pixel driving voltage line PL2*j* of the plurality of pixel driving voltage lines PL. For example, the (4i)th data line DL4*i* can be a fourth color data line or a green data line. The (2j)th pixel driving voltage line PL2*j* can be an even-numbered pixel driving voltage line of the plurality of pixel driving voltage lines PL. The (4i-1)th data line DL4*i*-1 and the (4i)th data line DL4*i* can be disposed adjacent to each other and parallel to each other.

Each of the first to fourth subpixel areas SPA1 to SPA4 can be categorized (or divided) into a first area A1 and a second area A2 based on the second direction Y.

The first area A1 (or light emitting area) can be disposed at an upper side of the gate line GL based on the second direction Y, and may not be overlapped with the gate line GL. The first areas A1 of the first to fourth subpixel areas SPA1 to SPA4 can have different sizes to each other.

The second area A2 (or circuit area) can be disposed at a lower side of the gate line GL based on the second direction Y, and can be overlapped with the gate line GL. The second areas A2 of the first to fourth subpixel areas SPA1 to SPA4 can substantially have the same size.

Each of the first to fourth subpixel areas SPA1 to SPA4 can be disposed in the second area A2 and include a pixel circuit PC which is disposed in the circuit area overlapped with the gate line GL.

The pixel circuit PC of each of the first to fourth subpixel areas SPA1 to SPA4 can selectively be connected to the first and second gate lines GLa and GLb of the gate line GL, the pixel driving voltage line PL, four data lines DL4*i*-3, DL4*i*-2, DL4*i*-1 and DL4*i*, and the reference voltage line RL.

The first gate line GLa can be disposed at one side area most adjacent to the first area A1 in the second area A2 of the first to fourth subpixel areas SPA1 to SPA4. The second gate line GLb can be disposed at the other side area spaced apart from the first gate line GLa in the second area A2 of the first to fourth subpixel areas SPA1 to SPA4.

The pixel circuit PC according to one embodiment can include a first switching transistor Tsw1, a second switching transistor Tsw2, a driving transistor Tdr, and a storage capacitor Cst. Each of the transistors Tsw1, Tsw2 and Tdr of the pixel circuit PC can be comprised of a thin-film transistor (TFT), and at least one of the thin-film transistors Tsw1, Tsw2 and Tdr can be a-Si TFT, a poly-Si TFT, an Oxide TFT, or an Organic TFT. For example, in the pixel circuit PC, some of the first switching transistor Tsw1, the second switching transistor Tsw2 and the driving transistor Tdr can be a thin-film transistor that includes a semiconductor layer (or active layer) made of low-temperature poly-Si (LTPS) having an excellent response characteristic, and the other of the first switching transistor Tsw1, the second switching transistor Tsw2 and the driving transistor Tdr can be a thin-film transistor that includes a semiconductor layer (or active layer) made of oxide having an excellent off current characteristic.

The first switching transistor Tsw1 can include a gate electrode GE that is connected to the first gate line GLa, a first source/drain electrode SDE1 that is connected to the data line DL adjacent thereto, and a second source/drain electrode SDE2 that is connected to the gate electrode GE of the driving transistor Tdr through a first contact hole CH1. The gate electrode of the first switching transistor Tsw1 can be a protrusion area protruded from one side of the first gate line GLa. The first switching transistor Tsw1 can be turned on in accordance with a first gate signal supplied to the first gate line GLa and supply the data voltage supplied from the data line DL to the gate electrode GE of the driving transistor Tdr.

According to one embodiment, the first source/drain electrode SDE1 of the first switching transistor Tsw1 disposed in the first subpixel area SPA1 can be a protrusion area protruded from one side of the (4i-3)th data line DL4*i*-3, the first source/drain electrode SDE1 of the first switching transistor Tsw1 disposed in the second subpixel area SPA2 can be a protrusion area protruded from one side of the (4i-2)th data line DL4*i*-2, the first source/drain electrode SDE1 of the first switching transistor Tsw1 disposed in the third subpixel area SPA3 can be a protrusion area protruded from one side of the (4i-1)th data line DL4*i*-1, and the first source/drain electrode SDE1 of the first switching transistor Tsw1 disposed in the fourth subpixel area SPA4 can be a protrusion area protruded from one side of the (4i)th data line DL4*i*.

The second switching transistor Tsw2 can include a gate electrode GE that is connected to the second gate line GLb, a first source/drain electrode SDE1 that is connected to the source electrode of the driving transistor Tdr, and a second source/drain electrode SDE2 that is connected to the reference voltage line RL adjacent thereto. The second switching transistor Tsw2 can supply the reference voltage supplied from the reference voltage line RL to the source electrode SE of the driving transistor Tdr in accordance with a second gate signal supplied to the second gate line GLb in the display mode. The second switching transistor Tsw2 can be turned on in accordance with a second gate signal supplied to the second gate line GLb in the sensing mode and supply a current output from the driving transistor Tdr to the reference voltage line RL or connect the source electrode SE of the driving transistor Tdr to the reference voltage line RL.

In each of the first to fourth subpixel areas SPA1 to SPA4, the gate electrode GE of the second switching transistor Tsw2 can be some area of the second gate line GLb or a protrusion area protruded from one side of the second gate line GLb. The first source/drain electrode SDE1 of the second switching transistor Tsw2 can be connected with a reference connection line RCL branched from the reference voltage line RL through at least one second contact hole CH2. The reference connection line RCL can be disposed to pass through the reference voltage line RL while being parallel with the second gate line GLb and electrically connected with the reference voltage line RL through the second contact hole CH2.

The storage capacitor Cst can be formed between the gate electrode GE and the source electrode SE of the driving transistor Tdr. The storage capacitor Cst according to one embodiment can include a first capacitor electrode provided with the gate electrode GE of the driving transistor Tdr, a second capacitor electrode provided with the source electrode of the driving transistor Tdr, and a dielectric layer formed in an overlap area between the first capacitor electrode and the second capacitor electrode. The storage capacitor Cst can charge (or store) a differential voltage between the gate electrode GE and the source electrode SE of the driving transistor Tdr and turns on the driving transistor Tdr in accordance with the charged voltage.

The driving transistor Tdr can include the gate electrode GE that is connected to the second source/drain electrode SDE2 of the first switching transistor Tsw1, the source electrode SE that is connected to the first source/drain electrode SDE1 of the second switching transistor Tsw2, and the drain electrode DE that is connected to the pixel driving voltage line PL. The driving transistor Tdr is turned on in accordance with the voltage of the storage capacitor Cst and controls the amount of a current flowing from the pixel driving voltage line PL to the light emitting device layer.

The drain electrode DE of the driving transistor Tdr disposed in the first subpixel area SPA1 can be implemented in the protrusion area protruded from the (2j-1)th pixel driving voltage line PL2*j*-1, and the drain electrode DE of the driving transistor Tdr disposed in the fourth subpixel area SPA4 of the plurality of subpixel areas SPA1 to SPA4 can be implemented in the protrusion area protruded from the (2j)th pixel driving voltage line PL2*j*.

The drain electrode DE of the driving transistor Tdr disposed in the second subpixel area SPA2 can electrically be connected to the (2j-1)th pixel driving voltage line PL2*j*-1 through a first internal power supply line IPL1. For example, the first internal power supply line IPL1 can be disposed on the same layer as the second gate line GLb in parallel with the second gate line GLb, can electrically be connected to the (2j-1)th pixel driving voltage line PL2*j*-1 through at least one third contact hole CH3, and can electrically be connected to the drain electrode DE of the driving transistor Tdr disposed in the second subpixel area SPA2 through a fourth contact hole CH4.

The drain electrode DE of the driving transistor Tdr disposed in the third subpixel area SPA3 can electrically be connected to the (2j)th pixel driving voltage line PL2*j* through a second internal power supply line IPL2. For example, the second internal power supply line IPL2 can be disposed on the same layer as the second gate line GLb in parallel with the second gate line GLb, can electrically be connected to the (2j)th pixel driving voltage line PL2*j* through at least one fifth contact hole CH5, and can electrically be connected to the drain electrode DE of the driving transistor Tdr disposed in the third subpixel area SPA3 through a sixth contact hole CH6.

According to one embodiment, each semiconductor layer of the transistors Tsw1, Tsw2 and Tdr of the pixel circuit PC can be disposed on a buffer layer 110 disposed on the substrate 100. The semiconductor layer has a source area, a drain area, and a channel area, and the channel area of the semiconductor layer can be covered (or overlaid) by a gate insulating film. The gate line GL and each of the transistors Tsw1, Tsw2 and Tdr can be disposed on the gate insulating film, and can be covered (or overlaid) by an inter-layer dielectric film 120. The data line DL, the pixel driving voltage line PL, the reference voltage line RL, and the source/drain electrode of the transistors Tsw1, Tsw2 and Tdr can be disposed on the inter-layer dielectric film 120, and can be covered (or overlaid) by a passivation layer 130. The passivation layer 130 can be covered (or overlaid) by an overcoat layer 140 (or planarization layer).

The overcoat layer 140 can be disposed on the entire display area of the substrate 100 to cover (or overlay) the pixel circuit PC. The overcoat layer 140 according to one embodiment can be made of an organic material such as photo acryl, benzocyclobutene, polyimide, and fluorine resin, but is not limited thereto.

According to one embodiment, each semiconductor layer of the transistors Tsw1, Tsw2 and Tdr of the pixel circuit PC can be disposed on a light-shielding layer which is disposed on the substrate 100.

The light-shielding layer can be disposed between the semiconductor layer of each of the transistors Tsw1, Tsw2 and Tdr and the substrate 100 to shield light entering the semiconductor layer through the substrate 100, thereby minimizing or preventing a threshold voltage change of the transistors Tsw1, Tsw2 and Tdr from occurring due to external light. Optionally, the light-shielding layer can electrically be connected to the source electrode of the transistors Tsw1, Tsw2 and Tdr, and therefore can serve as a lower gate electrode of the corresponding transistor. In this case, the threshold voltage change of the transistors Tsw1, Tsw2 and Tdr due to a bias voltage as well as the characteristic change caused by light is minimized or prevented.

Meanwhile, when the pixel circuit PC is operated by only display driving according to the display mode without sensing driving according to the sensing mode, the second switching transistor Tsw2 and the reference voltage line RL are omitted. At this time, the reference voltage line RL shown in FIG. 2 is changed to the pixel driving voltage line PL2*j*. When the second switching transistor Tsw2 is omitted from the pixel circuit PC and the reference voltage line RL is omitted from the unit pixel 12, the arrangement order of the pixel driving voltage line PL and the data line DL, which are disposed in the unit pixel 12, can be changed. For example, in FIG. 2, the (2j-1)th pixel driving voltage line PL2*j*-1 can be changed to the (4i-3)th data line DL4*i*-3. The (4i-3)th data line DL4*i*-3 and the (4i-2)th data line DL4*i*-2 which are adjacent to each other can be changed to the (2j-1)th pixel driving voltage line PL2*j*-1. The reference voltage line RL can be changed to the (4i-2)th data line DL4*i*-2 and the (4i-1)th data line DL4*i*-1 which are adjacent to each other. The (4i-1)th data line DL4*i*-1 and the (4i)th data line DL4*i* which are adjacent to each other can be changed to the (2j)th pixel driving voltage line PL2*j*. And, the 2jth pixel driving voltage line PL2*j* can be changed to the (4i)th data line DL4*i* and the (4i-3)th data line DL4*i*-3 which are adjacent to each other.

Each of the first to fourth subpixel areas SPA1 to SPA4 can include a light emission portion EP disposed in the first area A1, and a non-light emission portion NEP disposed in the second area A2 so as to surround the first area A1. In the following description, the light emission portion EP can be understood as an opening portion or an opening area, and the non-light emission portion NEP can be understood as a non-opening portion or a non-opening area.

The light emission portions EP of the first to fourth subpixel areas SPA1 to SPA4 can have different sizes to each other for improving luminance and a color temperature of a display image. For example, the light emission portions EP of each of the first to fourth subpixel areas SPA1 to SPA4 can be have different sizes to each other based on a color temperature of 6500K or more to be implemented in the light emitting display apparatus or the second subpixel 12*b*.

Any one of the light emission portions EP of the plurality of first to fourth subpixel areas SPA1 to SPA4 according to one embodiment can be divided (or separated) into first partial light emission portions EPw (or first opening portion) and second partial light emission portions EPα (or second opening portion), which have different sizes to each other.

Each of the first, third and fourth subpixel areas SPA1, SPA3 and SPA4 can include one light emission portion EP which is not divided. For example, the first subpixel area SPA1 can include a red light emission portion EPr (or red opening portion), the third subpixel area SPA3 can include a blue light emission portion EPb (or blue opening portion), and the fourth subpixel area SPA4 can include a green light emission portion EPg (or green opening portion). The light emission portions EP of the first, third and fourth subpixel areas SPA1, SPA3 and SPA4 can have different sizes to each other.

The light emission portion EP of the second subpixel area SPA2 can be implemented to be divided (or separated) into the first light emission portion EPw and the second light emission portion EPα. In the following description, the first light emission portion EPw can be understood as a first partial light emission portion, a first split light emission portion, a (2-1)th light emission portion, a white light emission portion, a first opening portion, a first partial opening portion, a first split opening portion, a (2-1)th opening portion, or a white opening portion. The second light emission portion EPα can be understood as a second partial light emission portion, a second split light emission portion, a (2-2)th light emission portion, an alpha light emission portion, an additional light emission portion, a second opening portion, a second partial opening portion, a second split opening portion, a (2-2)th opening portion, an alpha opening portion or an additional opening portion.

The first light emission portion EPw and the second light emission portion EPα can be implemented to have different sizes to each other. For example, the first light emission portion EPw can have a size greater than that of the second light emission portion EPα. The first light emission portion EPw and the second light emission portion EPα can be implemented to emit white light, thereby increasing luminance or a color temperature of a unit pixel.

According to the first embodiment, five light emission portions EPr, EPw, EPα, EPb and EPg in the unit pixel 12 can have sizes (EPw>EPb>EPr>EPg>EPα) in the order of the first light emission portion EPw, the blue light emission portion EPb, the red light emission portion EPr, the green light emission portion EPg, and the second light emission portion EPα. For example, based on each light emission portion of the first to fourth subpixel areas SPA1 to SPA4 disposed in a unit pixel of a light emitting display apparatus according to a comparison example having resolution of 4K, the red light emission portion EPr can have a size of 70% of a red light emission portion according to the comparison example, the blue light emission portion EPb can have a size of 90% of a blue light emission portion according to the comparison example, the green light emission portion EPg can substantially have the same size as that of a green light emission portion according to the comparison example, the first light emission portion EPw can have a size of 80 to 90% of a white light emission portion according to the comparison example, and the alpha light emission portion EPα can have a size obtained by adding respective size deviations of each of the red light emission portion EPr, the green light emission portion EPg, the blue light emission portion EPb, and the first light emission portion EPw in comparison with the light emission portions according to the comparison example. For example, in the unit pixel of the light emitting display apparatus according to the comparison example having resolution of 4K, a size occupied by the light emission portion in the first subpixel area can be 42%, approximately, a size occupied by the light emission portion in the second subpixel area can be 56%, approximately, a size occupied by the light emission portion in the third subpixel area can be 38%, approximately, and a size occupied by the light emission portion in the fourth subpixel area can be 29%, approximately.

According to the second embodiment, five light emission portions EPr, EPw, EPα, EPb and EPg in the unit pixel 12 can have sizes (EPw>EPb>EPα>EPg>EPr) in the order of the first light emission portion EPw, the blue light emission portion EPb, the second light emission portion EPα, the green light emission portion EPg, and the red light emission portion EPr. For example, based on each light emission portion of the first to fourth subpixel areas SPA1 to SPA4 disposed in a unit pixel of a light emitting display apparatus according to a comparison example having resolution of 4K, each of the blue light emission portion EPb and the green light emission portion EPg can substantially have the same size as that of each of the blue light emission portion and the green light emission portion according to the comparison example, the red light emission portion EPr can have a size of 60 to 99% of a red light emission portion according to the comparison example, the first light emission portion EPw can have a size of 85 to 99% of a white light emission portion according to the comparison example, and the second light emission portion EPα can have a size obtained by adding a size of 1 to 40% of the red light emission portion according to the comparison example to a size of 1 to 15% of the white light emission portion according to the comparison example.

According to the third embodiment, five light emission portions EPr, EPw, EPα, EPb and EPg in the unit pixel 12 can have sizes (EPw>EPr>EPb>EPg>EPα) in the order of the first light emission portion EPw, the red light emission portion EPr, the blue light emission portion EPb, the green light emission portion EPg, and the second light emission portion EPα.

For example, based on each light emission portion of the first to fourth subpixel areas SPA1 to SPA4 disposed in a unit pixel of a light emitting display apparatus according to a comparison example having resolution of 4K, each of the red light emission portion EPr and the green light emission portion EPg can substantially have the same size as that of each of the red light emission portion and the green light emission portion according to the comparison example, the blue light emission portion EPb can have a size of 80 to 99% of a blue light emission portion according to the comparison example, the first light emission portion EPw can have a size of 85 to 99% of a white light emission portion according to the comparison example, and the second light emission portion EPα can have a size obtained by adding a size of 1 to 20% of the blue light emission portion according to the comparison example to a size of 1 to 15% of the white light emission portion according to the comparison example.

For another example, based on each light emission portion of the first to fourth subpixel areas SPA1 to SPA4 disposed in a unit pixel of a light emitting display apparatus according to a comparison example having resolution of 4K, each of the red light emission portion EPr and the blue light emission portion EPb can substantially have the same size as that of each of the red light emission portion and the blue light emission portion according to the comparison example, the green light emission portion EPg can have a size of 90 to 99% of a green light emission portion according to the comparison example, the first light emission portion EPw can have a size of 85 to 99% of a white light emission portion according to the comparison example, and the second light emission portion EPα can have a size obtained by adding a size of 1 to 10% of the green light emission portion according to the comparison example to a size of 1 to 15% of the white light emission portion according to the comparison example.

At least one of the light emission portions EP of the first to fourth subpixel areas SPA1 to SPA4 according to one embodiment can include at least one bent area BA recessed or protruded along the first direction X. For example, one side of the red light emission portion EPr adjacent to the first light emission portion EPw can include a bent area BA recessed in a trapezoidal shape, and the first light emission portion EPw can include a bent area BA protruded toward the bent area BA of the red light emission portion EPr. Likewise, one side and/or the other side of each of the second light emission portion EPα, the blue light emission portion EPb, and the green light emission portion EPg can include a bent area BA recessed or protruded.

Meanwhile, four data lines DL and reference voltage lines RL disposed in the unit pixel 12 can be bent to overlap the bent area BA of the light emission portions EP in the first are A1 of each of the first to fourth subpixel areas SPA1 to SPA4.

The light emission portion EP of each of the first to fourth subpixel areas SPA1 to SPA4 according to one embodiment can include an uneven pattern portion 150 and a light emitting device layer EDL.

The uneven pattern portion 150 can be configured to have a curved (or uneven) shape in the overcoat layer 140 overlapped with the light emission portion EP of each of the first to fourth subpixel areas SPA1 to SPA4, whereby a progress path of light emitted from the light emitting device layer EDL is changed to increase light extraction efficiency. Therefore, the uneven pattern portion 150 can be understood as a non-flat portion, a non-planar portion, a fine structure, a light path controller, a microlens portion, a microlens array portion, or a light scattering portion.

The uneven pattern portion 150 according to one embodiment can include a plurality of convex portions 151 spaced apart from each other and a plurality of concave portions 153 disposed between the plurality of convex portions 151.

Each of the plurality of convex portions 151 can be provided in the overcoat layer 140 overlapped with the light emission portion EP to have a shape that can maximize external extraction efficiency of light emitted from a pixel based on an effective light emission area of the light emitting device layer EDL. Each of the plurality of convex portions 151 increases external extraction efficiency of light emitted from the light emitting device layer EDL by changing the progress path of the light emitted from the light emitting device layer EDL toward the substrate 100.

The plurality of convex portions 151 can respectively be connected to each other in all directions. For example, a bottom portion (or base surface) of each of the plurality of convex portions 151 can be connected to bottom portions of the other convex portions 151 adjacent thereto in all directions. Therefore, the overcoat layer 140 overlapped with the light emission portion EP can include a plurality of concave portions 153 formed between the plurality of convex portions 151. One concave portion 153 can be surrounded by the plurality of convex portions 151 adjacent thereto. The plurality of convex portions 151 surrounding one concave portion 153 can be disposed in two-dimensionally hexagonal shape (or honeycomb shape). For example, the plurality of convex portions 151 can be arranged to have a hexagonal shape (or a honeycomb structure).

Figure 4:
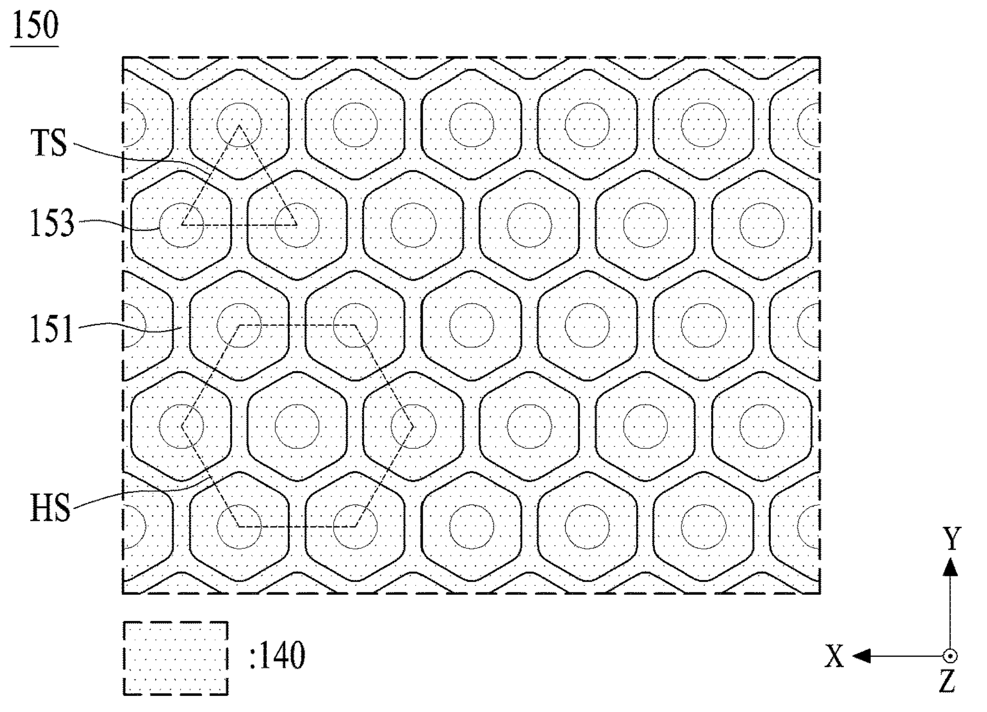
FIG. 4 is a plan view illustrating a planar structure of an uneven pattern portion shown in FIG. 3.

Each of the plurality of concave portions 153 can be disposed to be recessed from an upper surface (or surface) of the overcoat layer 140 corresponding between the plurality of convex portions 151. The plurality of concave portions 153 can respectively be disposed in parallel in a zigzag shape along the second direction Y while being spaced apart from each other along the first direction X. For example, the plurality of concave portions 153 can respectively be disposed in a lattice shape having a constant interval, and the concave portions 153 adjacent to each other can be disposed alternately along the second direction Y. For example, as shown in FIG. 4, three adjacent concave portions 153 can be disposed in two-dimensionally triangular shape, and line segments among centers of three adjacent concave portions 153 can constitute two-dimensionally triangular shape TS. Also, the plurality of concave portions 153 can respectively be surrounded by six concave portions 153 disposed around them. In this case, six concave portions 153 disposed to surround one concave portion 153 can be disposed in two-dimensionally hexagonal shape HS, and line segments among centers of six concave portions 153 disposed to surround one concave portion 153 can constitute two-dimensionally hexagonal shape HS. For example, the plurality of convex portions 151 and the plurality of concave portions 153 can be disposed in two-dimensionally honeycomb shape.

The uneven pattern portion 150 that includes the plurality of convex portions 151 and the plurality of concave portions 153 can be formed through an etching process of the overcoat layer using a mask pattern after the mask pattern is formed on the overcoat layer 140 on the light emission portion EP through a photolithography process using a photoresist. For example, a positive photoresist can be used as the photoresist to improve productivity.

Referring to FIGS. 2 and 3 again, the light emitting device layer EDL disposed in the light emission portion EP of each of the first to fourth subpixel areas SPA1 to SPA4 can include an anode electrode AE, a self-light emitting device SED, and a cathode electrode CE.

The anode electrode AE can be individually disposed on the overcoat layer 140 on the substrate 100 corresponding to the light emission portion EP of each of the first to fourth subpixel areas SPA1 to SPA4. The anode electrode AE can have a size and a shape corresponding to the light emission portion EP of each of the first to fourth subpixel areas SPA1 to SPA4. The anode electrode AE according to one embodiment can be made of a transparent conductive material such as transparent conductive oxide (TCO) to allow light emitted from the self-light emitting device SED to be transmitted toward the substrate.

The anode electrode AE disposed in each of the light emission portions EPr, EPb and EPg of the first, third, and fourth subpixel areas SPA1, SPA3, and SPA4 can be implemented in one body which is not divided, and can include an extension portion extended toward the pixel circuit PC disposed in the non-light emission portion NEP. The extension portion of the anode electrode AE can be electrically connected with the source electrode SE of the driving transistor Tdr of the corresponding pixel circuit PC disposed in the non-light emission portion NEP through an electrode contact hole ECH disposed in the overcoat layer 140 and the passivation layer 130. Therefore, the anode electrode AE of each of the first, third, and fourth subpixel areas SPA1, SPA3, and SPA4 can individually be supplied with a data current from the driving transistor Tdr of the corresponding pixel circuit PC.

The anode electrodes AE of the first, third and fourth subpixel areas SPA1, SPA3, and SPA4 according to one embodiment can have different sizes to each other. For example, the anode electrode AE of the first subpixel area SPA1 can be a red anode electrode AEr, the anode electrode AE of the third subpixel area SPA3 can be a blue anode electrode AEb, and the anode electrode AE of the fourth subpixel area SPA4 can be a green anode electrode AEg.

The anode electrode AE of the second subpixel area SPA2 according to one embodiment can be divided (or split) into a first anode electrode AEw and a second anode electrode AEα, which are spaced apart from each other.

The first anode electrode AEw and the second anode electrode AEα can spatially be spaced apart (or separated) from each other in the first area A1 or the light emission portion EP of the second subpixel area SPA2. For example, the interval between the first anode electrode AEw and the second anode electrode AEα can be set to 100 nanometers to several hundreds of micrometers.

The first anode electrode AEw can have a size greater than that of the first light emission portion EPw and can have a size relatively greater than that of the second anode electrode AEα. For example, the other portion except an edge portion of the first anode electrode AEw can be overlapped with the first light emission portion EPw. In the following description, the first anode electrode AEw can be understood as a first electrode, a first split electrode, or a white anode electrode.

The second anode electrode AEα can have a size greater than that of the second light emission portion EPα and can have a size relatively smaller than that of the first anode electrode AEw. For example, the other portion except an edge portion of the second anode electrode AEα can be overlapped with the second light emission portion EPα. In the following description, the second anode electrode AEα can be understood as a second electrode, a second split electrode, or an alpha anode electrode.

Each of the first anode electrode AEw and the second anode electrode AEα can include an extension portion extended toward the pixel circuit PC disposed in the non-light emission portion NEP. Each extension portion of the first anode electrode AEw and the second anode electrode AEα can commonly connected to the source electrode SE of the driving transistor Tdr of the pixel driving circuit PC disposed in the non-light emission portion NEP through an electrode contact hole ECH disposed in the overcoat layer 140 and the passivation layer 130. Therefore, each of the first anode electrode AEw and the second anode electrode AEα can simultaneously be supplied with the same data current from the driving transistor Tdr of the corresponding pixel circuit PC.

The self-light emitting device SED of the light emitting device layer EDL can be disposed on the anode electrode AE. The self-light emitting device SED according to one embodiment can be an organic light emitting device, a quantum dot light emitting device, an inorganic light emitting device, or a micro light emitting device. For example, the self-light emitting device SED made of an organic light emitting device can include a hole function layer disposed on the anode electrode, an organic light emitting layer disposed on the hole function layer, and an electron function layer disposed on the organic light emitting layer.

According to one embodiment, the self-light emitting device SED disposed in each of the first to fourth subpixel areas SPA1 to SPA4 can be disposed to emit light of different colors. For example, the self-light emitting device SED of the first subpixel area SAP1 can include a red organic light emitting layer, the self-light emitting device SED of the third subpixel area SAP3 can include a blue organic light emitting layer, and the self-light emitting device SED of the fourth subpixel area SAP4 can include a green organic light emitting layer. The self-light emitting device SED of the second subpixel area SAP2 can include a plurality of organic light emitting layers for emitting white light.

The self-light emitting device of the second subpixel area SPA2 according to one embodiment can have a stack structure that a first organic light emitting layer and a second organic light emitting layer are deposited. The first organic light emitting layer according to one embodiment emits first light, and can include any one among a blue organic light emitting cell, a green organic light emitting cell, a red organic light emitting cell, a yellow organic light emitting cell, and a yellow-green organic light emitting cell. The second organic light emitting layer can include the other one except an organic light emitting cell of the first organic light emitting layer among a blue organic light emitting cell, a green organic light emitting cell, a red organic light emitting cell, a yellow organic light emitting cell, and a yellow-green organic light emitting cell. Additionally, the self-light emitting device of the second subpixel area SPA2 can further include a third organic light emitting layer that includes the other one except an organic light emitting cell of the first and second organic light emitting layers among a blue organic light emitting cell, a green organic light emitting cell, a red organic light emitting cell, a yellow organic light emitting cell, and a yellow-green organic light emitting cell.

According to another embodiment, the self-light emitting device SED disposed in each of the first to fourth subpixel areas SPA1 to SPA4 can be implemented as a common layer for emitting white light. For example, the self-light emitting device SED disposed in each of the first to fourth subpixel areas SAP1 to SPA4 can include the first organic light emitting layer and the second organic light emitting layer, or can include the first organic light emitting layer, the second organic light emitting layer, and the third organic light emitting layer.

Additionally, the self-light emitting device SED disposed in each of the first to fourth subpixel areas SPA1 to SPA4 can be changed to the quantum dot light emitting device or can further include a quantum dot light emitting layer to improve a color reproduction rate.

The cathode electrode CE of the light emitting device layer EDL can be disposed on the entire display panel of the substrate 100 to directly contact the self-light emitting device SED. The cathode electrode CE according to one embodiment can include a metal material having high reflectance to reflect light, which is emitted from the self-light emitting device SED and enters there, toward the substrate 100.

The display panel according to one embodiment of the present disclosure can further include a bank pattern 160 and an encapsulation layer 170.

The bank pattern 160 can be disposed on the non-light emission portion NEP of each of the plurality of subpixel areas SPA1 to SPA4, and can define a light emission portion EP of each of the subpixel areas SPA1 to SPA4. The bank pattern 160 can be overlapped with all or some of the pixel driving line PL, the data line DL and the reference voltage line RL, which are disposed in the unit pixel 12.

The bank pattern 160 can be formed on the overcoat layer 140 to cover (or overlay) the edge portion of the anode electrode AE disposed in each of the plurality of subpixel areas SPA1 to SPA4. For example, the bank pattern 160 can be formed of an organic material such as benzocyclobutene (BCB) based resin, acryl resin, or polyimide resin, but is not limited thereto. Alternatively, the bank pattern 160 can be formed of a photoresist that includes a black dye, and in this case, the bank pattern 160 can serve as a light-shielding member that prevents a color mixture between the adjacent subpixel areas SPA1 to SPA4 from occurring.

When the light emitting device layer EDL can be implemented as a common layer, each of the self-light emitting device SED and the cathode electrode CE can be formed on the bank pattern 160. For example, the self-light emitting device SED can be formed to cover (or overlay) the edge portion of the anode electrode AE and the bank pattern 160, and the cathode electrode CE can be formed to cover (or overlay) the self-light emitting device SED.

The encapsulation layer 170 can be formed on the display area AA of the substrate 100 to cover (or overlay) the cathode electrode CE. The encapsulation layer 170 can serve to protect the thin film transistor and the self-light emitting device SED from external impact and prevent oxygen or/and water and particles from being permeated into the light emitting device layer EDL. The encapsulation layer 170 according to one embodiment can include at least one inorganic film. The encapsulation layer 170 can further include at least one organic film. For example, the encapsulation layer 170 can include a first inorganic encapsulation layer, an organic encapsulation layer, and a second inorganic encapsulation layer.

Optionally, the encapsulation layer 170 can be modified to a filling member surrounding all the pixels. In this case, the light emitting display panel 10 according to the present disclosure further includes an encapsulation substrate 180 attached onto the substrate 100 by using the filling member as a medium. The encapsulation substrate 180 can be made of a plastic material, a glass material, or a metal material. The filling member can include a getter material that absorbs oxygen or/and water.

Additionally, the display panel according to the present disclosure can further include a color filter layer CFL. The color filter layer CFL can be applied when each of the plurality of subpixel areas SPA1 to SPA4 emits white light.

The color filter layer CFL can be disposed to overlap the light emission portions EPr, EPb, and EPg of the first, third and fourth subpixel areas SPA1, SPA3 and SPA4. The color filter layer CFL can be provided under the anode electrode AE. For example, the color filter layer CFL can be provided between the substrate 100 and the overcoat layer 140 to overlap the light emission portions EPr, EPb, and EPg. For example, the color filter layer CFL can be interposed between the passivation layer 130 and the overcoat layer 140 to overlap the light emission portions EPr, EPb, and EPg.

The color filter layer CFL according to one embodiment can include a red color filter CFr overlapped with the light emission portion EPr of the first subpixel area SPA1, a blue color filter CFb overlapped with the light emission portion EPb of the third subpixel area SPA3, and a green color filter CFg overlapped with the light emission portion EPg of the fourth subpixel area SPA4.

Each of the red color filter CFr, the blue color filter CFb, and the green color filter CFg can have a size greater or wider than that of the corresponding light emission portions EPr, EPb, and EPg. For example, each end of the red color filter CFr, the blue color filter CFb, and the green color filter CFg can be extended to overlap the non-light emission portion NEP adjacent thereto by passing through a subpixel boundary SPB between the subpixel areas SPA1 to SPA4. Additionally, the ends of the red color filter CFr, the blue color filter CFb, and the green color filter CFg can overlap each other at the subpixel boundary SPB to minimize or prevent light leakage or color mixture between the adjacent subpixel areas SPA1 to SPA4.

Each end of the red color filter CFr, the blue color filter CFb and the green color filter CFg according to one embodiment can include a quantum dot re-emitting light in accordance with light emitted from the light emitting device layer EDL to the substrate 100 to have a size for emitting light of a color set in the subpixel. In this case, the red color filter CFr may not contain a red quantum dot to reduce light transmittance (or light extraction rate) of a long wavelength area, or can further include a long wavelength absorption material (or dye) that absorbs at least a portion of long wavelength light. For example, the long wavelength absorption material can increase a color temperature by absorbing a wavelength of 620 nm to 700 nm and reducing light transmittance (or light extraction rate) of the long wavelength area.

Additionally, the light emitting display apparatus according to the present disclosure can further include a polarization film 190 that is attached to a rear surface (or light extraction surface) of the substrate 100. The polarization film 190 changes external light which is reflected by the film transistors and/or the lines which are provided in the display area into a circularly polarized state to improve visibility and a contrast ratio of the light emitting display device. For example, the polarization film 190 can be implemented as a circularly polarization film.

Figure 5:
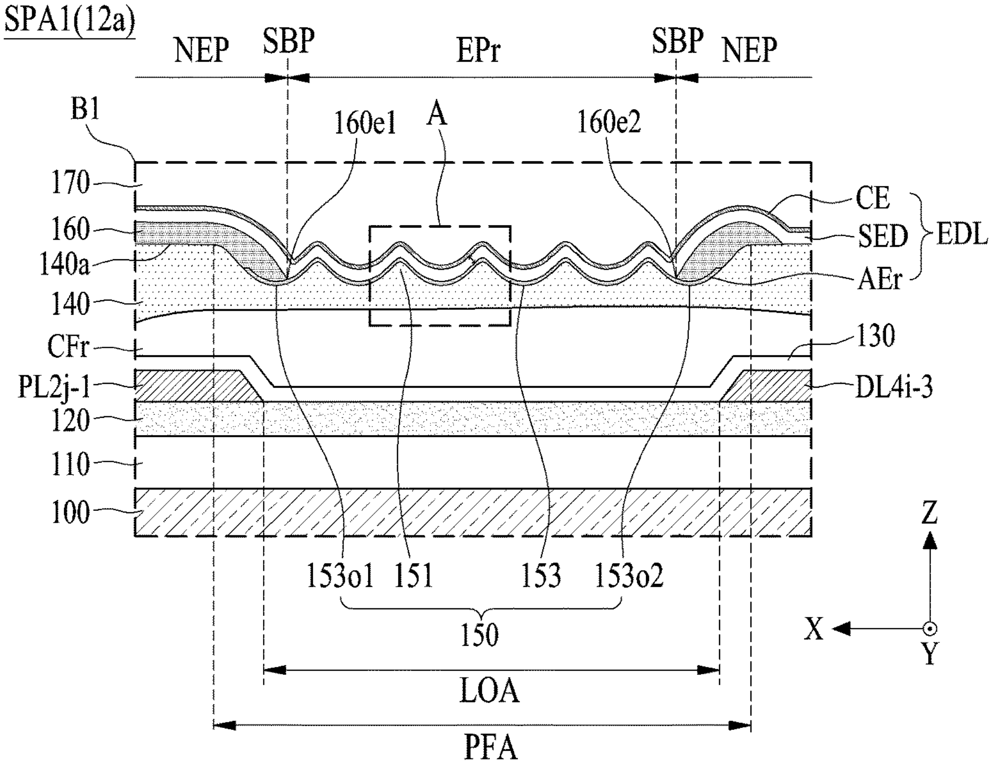
FIG. 5 is an enlarged view illustrating a region 'B1' shown in FIG. 3.
Figure 6:
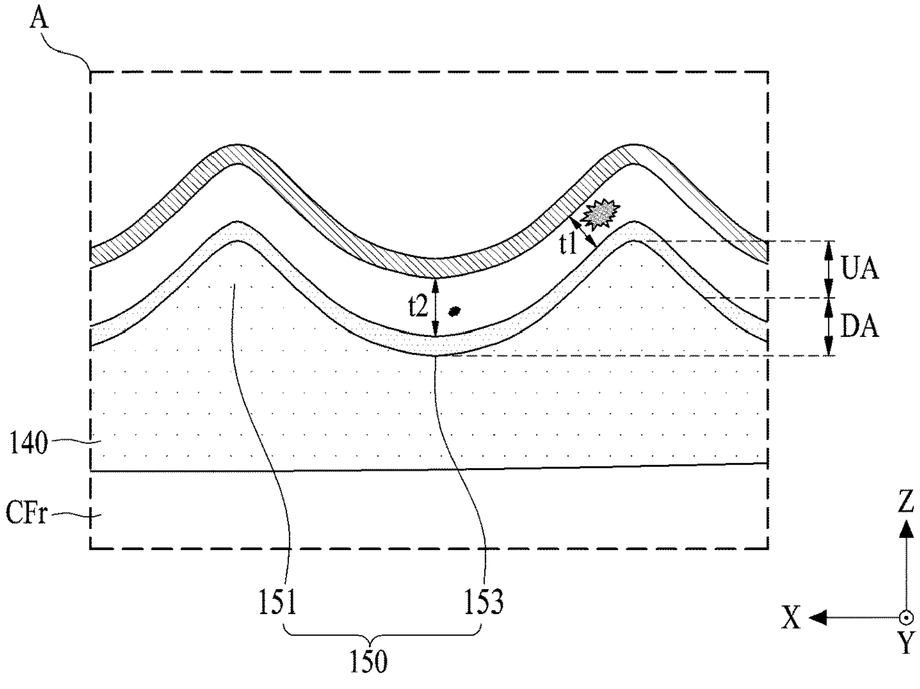
FIG. 6 is an enlarged view illustrating a region 'A' shown in FIG. 5.

FIG. 5 is an enlarged view illustrating a region 'B1' shown in FIG. 3 for illustrating a first subpixel area according to one embodiment of the present disclosure, and FIG. 6 is an enlarged view illustrating a portion 'A' shown in FIG. 5.

Referring to FIGS. 2 to 6, the first subpixel area SPA1 (or the first subpixel 12*a*) according to one embodiment of the present disclosure can include a light output area LOA corresponding between the (2j-1)th pixel driving voltage line PL2*j*-1 and the (4i-3)th data line DL4*i*-3, and a pattern formation area PFA corresponding to the uneven pattern portion 150, and a red light emission portion EPr defined by the bank pattern 160.

The light output area LOA can be disposed between the (2j-1)th pixel driving voltage line PL2*j*-1 and the (4i-3)th data line DL4*i*-3 which are disposed in the first area A1 of the first subpixel area SPA1.

The pattern formation area PFA can be defined as an area where the uneven pattern portion 150 in the first area A1 of the first subpixel area SPA1 is disposed. The pattern formation area PFA can be defined as an area lower than the non-pattern portion (or the uppermost surface) 140*a* of the area of the overcoat layer 140 disposed in the first subpixel area SPA1. The pattern formation area PFA can have a size greater than that of the light output area LOA. Therefore, the uneven pattern portion 150 implemented in the overcoat layer 140 corresponding to the pattern formation area PFA can have a size greater than that of the light output area LOA to progress light emitted from the light emitting device layer EDL toward the light output area LOA.

A boundary portion BP between an end of the pattern formation area PFA and the non-pattern portion 140*a* of the overcoat layer 140 can be arranged on the (2j-1)th pixel driving voltage line PL2*j*-1 and the (4i-3)th data line DL4*i*-3. The outmost concave portion 153*o* of the plurality of concave portions 153 included in the uneven pattern portion 150 can be overlapped with each of the (2j-1)th pixel driving voltage line PL2*j*-1 and the (4i-3)th data line DL4*i*-3.

The red light emission portion EPr can include a light emitting device layer EDL disposed on the uneven pattern portion 150. The light emitting device layer EDL can include an anode electrode AEr, a self-light emitting device SED, and a cathode electrode CE.

The anode electrode AEr (or the red anode electrode) can have a size smaller than that of the pattern formation area PFA. For example, a formation area of the anode electrode AEr in the first subpixel area SPA1 can have a size smaller than that of the pattern formation area PFA. The end of the anode electrode AEr according to one embodiment can be arranged on an inclined surface of the outmost concave portion 153*o* overlapped with each of the (2j-1)th pixel driving voltage line PL2*j*-1 and the (4i-3)th data line DL4*i*-3. For example, the end of the anode electrode AEr can be arranged on the inclined surface between the bottom surface of the outmost concave portion 153*o* and the non-pattern portion 140*a* of the overcoat layer 140.

Since the anode electrode AEr is directly in contact with the uneven pattern portion 150, the anode electrode AEr can include a shape that follows a surface morphology of the uneven pattern portion 150. For example, since the anode electrode AEr is formed (or deposited) on the uneven pattern portion 150 of the overcoat layer 140 to have a relatively thin thickness, it can have a surface morphology that follows the surface morphology of the uneven pattern portion 150. Therefore, the anode electrode AEr can be disposed in a conformal morphology, which follows a surface morphology of the uneven pattern portion 150, by a deposition process of a transparent conductive material.

The self-light emitting device SED can be formed on the anode electrode AEr and therefore can directly be in contact with the anode electrode AEr. The self-light emitting device SED according to one embodiment can be formed (or deposited) to have a thickness relatively thicker than that of the anode electrode AEr, whereby the self-light emitting device SED can have a surface morphology different from that of the anode electrode AEr.

The self-light emitting device SED according to one embodiment can have a first thickness t1 in an upper area UA that includes a peak portion of the convex portion 151 of the uneven pattern portion 150, and can have a second thickness t2 thicker than the first thickness t1 in a downward area (or a lower area) DA that includes a bottom portion of the concave portion 153. Therefore, the self-light emitting device SED can have an effective light emission area and a non-effective light emission area in accordance with the thicknesses t1 and t2. The effective light emission area of the self-light emitting device SED is an area where relatively strong light emission occurs, and can be set to the upper area UA of the convex portions 151, and the non-effective light emission area of the self-light emitting device SED is an area where relatively weak light emission occurs, and can be set to the downward area DA of the convex portions 151. Therefore, a diameter and a height of the convex portion 151 can be implemented such that light emission does not occur in the downward area DA of the convex portions 151 and light emission occurs in only the upper area UA of the convex portions 151, based on power consumption and light emission efficiency.

The cathode electrode CE can be formed on the self-light emitting device SED and therefore can directly be in contact with the self-light emitting device SED. The cathode electrode CE according to one embodiment can be formed (or deposited) on the self-light emitting device SED to have a thickness relatively thinner than that of the self-light emitting device SED. Therefore, the cathode electrode CE can be implemented in a conformal shape that follows a surface morphology of the self-light emitting device SED as it is.

The red light emission portion EPr can have a size smaller than that of the light output area LOA. Also, the red light emission portion EPr can have a second largest size (a middle size or a smallest size) next to the first light emission portion EPw of the second subpixel SPA2 among the light emission portions EPr, EPw, EPα, EPb and EPg of the first to fourth subpixel areas SPA1 to SPA4, based on a color temperature to be implemented in the light emitting display apparatus or the second subpixel 12*b*. According to one embodiment, light emitted from the red light emission portion EPr can be outputted toward the substrate 100 through the light output area LOA without being trapped in the light emitting device layer EDL by the uneven pattern portion 150. Therefore, the red light emission portion EPr having the uneven pattern portion 150 can have a luminance increase rate of 70% in comparison with the red light emission portion according to the comparison example having no uneven pattern portion. As a result, the red light emission portion EPr according to the present disclosure can reduce a color temperature due to a relatively excessive luminance increase rate. Therefore, the size of the red light emission portion EPr can be set within the range that can increase a color temperature of the second subpixel area SPA2 based on the luminance increase rate due to the uneven pattern portion 150.

The bank pattern 160 defines the red light emission portion EPr of the first subpixel area SPA1, and can be implemented to cover (or overlay) the edge portion of the anode electrode AEr, the edge portion of the uneven pattern portion 150, and the non-pattern portion 140*a* of the overcoat layer 140. The bank pattern 160 can be disposed on each of the (2j-1)th pixel driving voltage line PL2*j*-1 and the (4i-3)th data line DL4*i*-3.

According to one embodiment, the bank pattern 160 disposed on the (2j-1)th pixel driving voltage line PL2*j*-1 can cover (or overlay) a portion of the uneven pattern portion 150 disposed on the (2j-1)th pixel driving voltage line PL2*j*-1. For example, a first end 160*e*1 of the bank pattern 160 disposed on the (2j-1)th pixel driving voltage line PL2*j*-1 can be arranged on a first outmost concave portion 153*o*1 among the plurality of concave portions 153 disposed in the uneven pattern portion 150 on the (2j-1)th pixel driving voltage line PL2*j*-1. For example, the first end 160*e*1 of the bank pattern 160 can be arranged on an inclined surface between a bottom surface of the first outmost concave portion 153*o*1 and a peak portion of the convex portion 151 adjacent to the first outmost concave portion 153*o*1, and can be overlapped with the edge portion of the light output area LOA without being overlapped with the (2j-1)th pixel driving voltage line PL2*j*-1.

According to one embodiment, the bank pattern 160 disposed on the (4i-3)th data line DL4*i*-3 can cover a portion of the uneven pattern portion 150 disposed on the (4i-3)th data line DL4*i*-3. For example, a second end 160*e*2 of the bank pattern 160 disposed on the (4i-3)th data line DL4*i*-3 can be arranged on a second outmost concave portion 153*o*2 of the plurality of concave portions 153 disposed in the uneven pattern portion 150 on the (4i-3)th data line DL4*i*-3. For example, the second end 160*e*2 of the bank pattern 160 can be arranged on an inclined surface between a bottom surface of the second outmost concave portion 153*o*2 and a peak portion of the convex portion 151 adjacent to the second outmost concave portion 153*o*2, and can be overlapped with the edge portion of the light output area LOA without being overlapped with the (4i-3)th data line DL4*i*-3.

The bank pattern 160 can reduce a step difference (or a stepped portion) at the boundary portion between the uneven pattern portion 150 and the overcoat layer 140 by covering (or overlaying) the edge portion of the uneven pattern portion 150. As a result, electric contact (or short) between the anode electrode AEr and the cathode electrode CE due to a thickness reduction of the self-light emitting device SED, which is generated at the boundary portion between the uneven pattern portion 150 and the overcoat layer 140 by the height of the bank pattern 160, can be prevented by the bank pattern 160.

Figure 7:
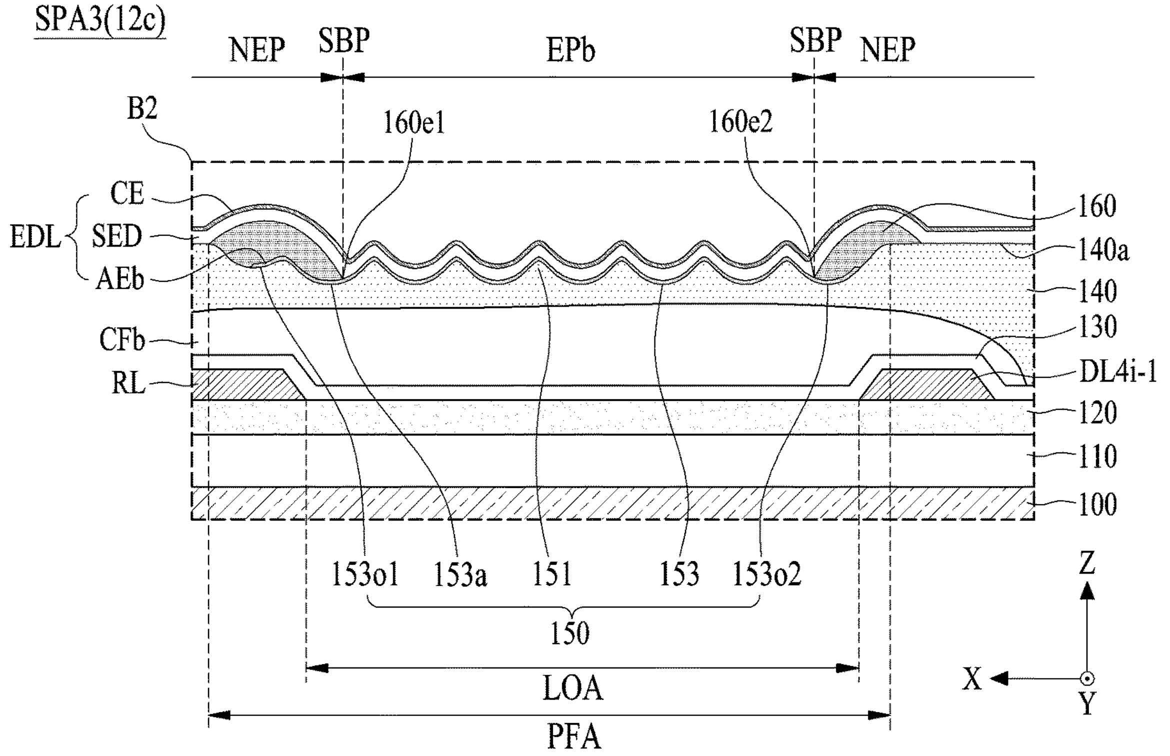
FIG. 7 is an enlarged view of a region 'B2' shown in FIG. 3.

FIG. 7 is an enlarged view of a portion 'B2' shown in FIG. 3 for illustrating a third subpixel area according to one embodiment of the present disclosure.

Referring to FIGS. 2, 3 and 7, the third subpixel area SPA3 (or the third subpixel 12*c*) according to one embodiment of the present disclosure can include a light output area LOA corresponding between the reference voltage line RL and the (4i-1)th data line DL4*i*-1, a pattern formation area PFA corresponding to the uneven pattern portion 150, a blue light emission portion EPb defined by the bank pattern 160. Since the third subpixel area SPA3 is substantially the same as the first subpixel area SPA1 except that each of the light output area LOA, the pattern formation area PFA and the blue light emission portion EPb has a size different from that of each of the light output area LOA, the pattern formation area PFA and the red light emission portion EPr of the first subpixel area SPA1 shown in FIG. 5 and also except the position of the bank pattern 160, and their repetitive descriptions are omitted or will be briefly described below.

The light output area LOA can be disposed between the (4i-1)th data line DL4*i*-1 and the reference voltage line RL, which are disposed in the first area A1 of the third subpixel area SPA3.

The blue light emission portion EPb can include a light emitting device layer EDL disposed on the uneven pattern portion 150. The light emitting device layer EDL can include an anode electrode AEb, a self-light emitting device SED and a cathode electrode CE.

The anode electrode (or blue anode electrode) AEb can have a size smaller than that of the pattern formation area PFA. For example, in the third subpixel area SPA3, the formation area of the anode electrode AEb can have a size smaller than that of the pattern formation area PFA. An end of the anode electrode AEb according to one embodiment can be arranged in the outmost concave portion 153*o* overlapped with each of the reference voltage line RL and the (4i-1)th data line DL4*i*-1. For example, the end of the anode electrode AEb disposed on the reference voltage line RL can be arranged on the bottom surface of the outmost concave portion 153*o*, and the end of the anode electrode AEb overlapped with the (4i-1)th data line DL4*i*-1 can be arranged on the inclined surface between the bottom surface of the outmost concave portion 153*o* and the non-pattern portion 140*a* of the overcoat layer 140. Since the anode electrode AEb is directly in contact with the uneven pattern portion 150 disposed on the overcoat layer 140 of the pattern formation area PFA, the anode electrode AEb can include a morphology that follows a surface morphology of the uneven pattern portion 150.

Since each of the self-light emitting device SED and the cathode electrode CE of the blue light emission portion EPb is substantially the same as each of the self-light emitting device SED and the cathode electrode CE of the red light emission portion EPr disposed in the first subpixel area SPA1, and its repetitive description will be omitted.

The blue light emission portion EPb can have a size smaller than that of the light output area LOA. Also, the blue light emission portion EPb can have a second largest size next to the first light emission portion EPw of the second subpixel SPA2 or the red light emission portion EPr of the first subpixel area SPA1 among the light emission portions EPr, EPw, EPα, EPb and EPg of the first to fourth subpixel areas SPA1 to SPA4, based on a color temperature to be implemented in the light emitting display apparatus or the second subpixel 12*b*. According to one embodiment, the blue light emission portion EPb having the uneven pattern portion 150 can have a luminance increase rate of 20% in comparison with the blue light emission portion according to the comparison example having no uneven pattern portion. Therefore, the size of the blue light emission portion EPb can be set within the range that can increase a color temperature of the second subpixel area SPA2 based on the luminance increase rate due to the uneven pattern portion 150.

The bank pattern 160 defines the blue light emission portion EPb of the third subpixel area SPA3, and can be implemented to cover (or overlay) the edge portion of the anode electrode AEb, the edge portion of the uneven pattern portion 150, and the non-pattern portion 140*a* of the overcoat layer 140. The bank pattern 160 can be disposed on each of the reference voltage line RL and the (4i-1)th data line DL4*i*-1.

According to one embodiment, the bank pattern 160 disposed on the reference voltage line RL can cover (or overlay) the entire at least one concave portion 153 of the uneven pattern portion 150 disposed on the reference voltage line RL. For example, a first end 160*e*1 of the bank pattern 160 disposed on the reference voltage line RL can be arranged on an outer concave portion 153*a* adjacent to the first outmost concave portion 153*o*1 among the plurality of concave portions 153 disposed in the uneven pattern portion 150 on the reference voltage line RL. For example, the first end 160*e*1 of the bank pattern 160 can be arranged on an inclined surface between a bottom surface of the outer concave portion 153*a* and a peak portion of the convex portion 151 adjacent to the outer concave portion 153*a*, and can be overlapped with the edge portion of the light output area LOA without being overlapped with the reference voltage line RL.

According to one embodiment, the bank pattern 160 disposed on the (4i-1)th data line DL4*i*-1 can cover (or overlay) a portion of the uneven pattern portion 150 disposed on the (4i-1)th data line DL4*i*-1. For example, a second end 160*e*2 of the bank pattern 160 disposed on the (4i-1)th data line DL4*i*-1 can be arranged on a second outmost concave portion 153*o*2 of the plurality of concave portions 153 disposed in the uneven pattern portion 150 on the (4i-1)th data line DL4*i*-1. For example, the second end 160*e*2 of the bank pattern 160 can be arranged on an inclined surface between a bottom surface of the second outmost concave portion 153*o*2 and a peak portion of the convex portion 151 adjacent to the second outmost concave portion 153*o*2, and can be overlapped with the edge portion of the light output area LOA without being overlapped with the (4i-1)th data line DL4*i*-1.

The bank pattern 160 can reduce a step difference (or a stepped portion) at the boundary portion between the uneven pattern portion 150 and the overcoat layer 140 by covering (or overlaying) the edge portion of the uneven pattern portion 150. As a result, electric contact (or short) between the anode electrode AEb and the cathode electrode CE due to a thickness reduction of the self-light emitting device SED, which is generated at the boundary portion between the uneven pattern portion 150 and the overcoat layer 140 by the height of the bank pattern 160, can be prevented by the bank pattern 160.

Figure 8:
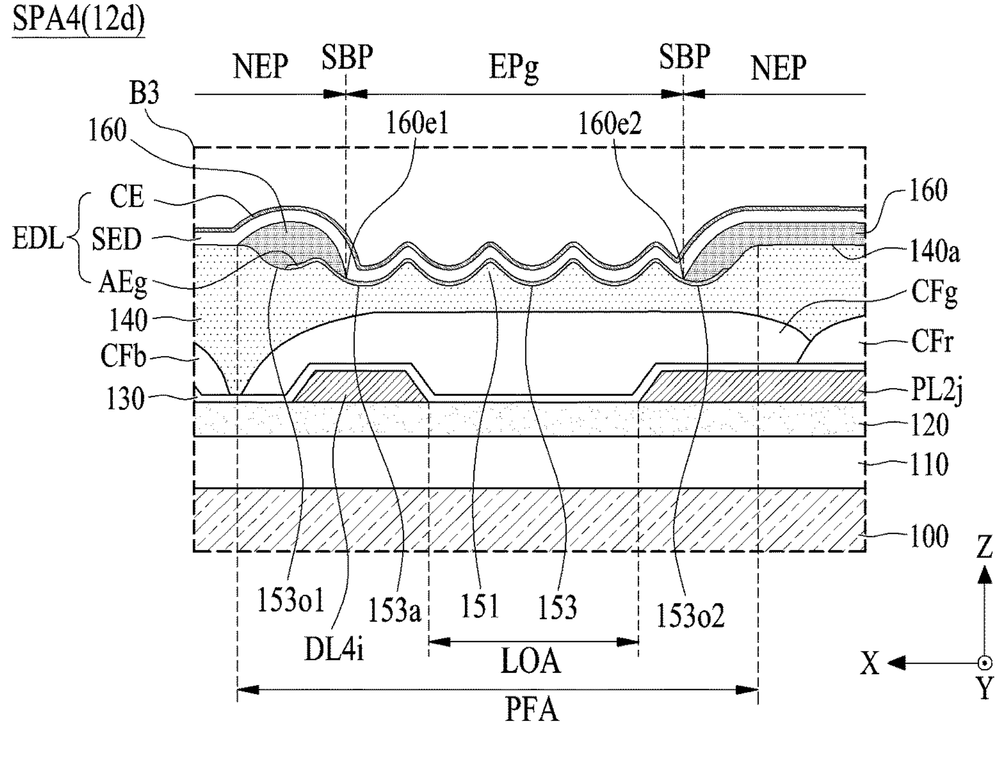
FIG. 8 is an enlarged view of a region 'B3' shown in FIG. 3.

FIG. 8 is an enlarged view of a portion 'B3' shown in FIG. 3 for illustrating a fourth subpixel area according to one embodiment of the present disclosure.

Referring to FIGS. 2, 3 and 8, the fourth subpixel area SPA4 (or the fourth subpixel 12*d*) according to one embodiment of the present disclosure can include a light output area LOA corresponding between the (4i)th data line DL4*i* and the (2j)th pixel driving voltage line PL2*j*, a pattern formation area PFA corresponding to the uneven pattern portion 150, a green light emission portion EPg defined by the bank pattern 160. Since the fourth subpixel area SPA4 is substantially the same as the third subpixel area SPA3 except that each of the light output area LOA, the pattern formation area PFA and the green light emission portion EPg has a size different from that of each of the light output area LOA, the pattern formation area PFA and the blue light emission portion EPb of the third subpixel area SPA3 shown in FIG. 7 and also except the position of the bank pattern 160, and their repetitive descriptions are omitted or will be briefly described below.

The light output area LOA can be disposed between the (4i)th data line DL4*i* and the (2j)th pixel driving voltage line PL2*j*, which are disposed in the first area A1 of the fourth subpixel area SPA4.

The green light emission portion EPg can include a light emitting device layer EDL disposed on the uneven pattern portion 150. The light emitting device layer EDL can include an anode electrode AEg, a self-light emitting device SED and a cathode electrode CE.

The anode electrode (or green anode electrode) AEg can have a size smaller than that of the pattern formation area PFA. For example, in the fourth subpixel area SPA4, the formation area of the anode electrode AEg can have a size smaller than that of the pattern formation area PFA. An end of the anode electrode AEg according to one embodiment can be arranged in the outmost concave portion 153*o* overlapped with each of the (4i)th data line DL4*i* and the (2j)th pixel driving voltage line PL2*j*. For example, the end of the anode electrode AEg disposed on the (4i)th data line DL4*i* can be arranged on the bottom surface of the outmost concave portion 153*o*, and the end of the anode electrode AEg overlapped with the (2j)th pixel driving voltage line PL2*j* can be arranged on the inclined surface between the bottom surface of the outmost concave portion 153*o* and the non-pattern portion 140*a* of the overcoat layer 140. Since the anode electrode AEg is directly in contact with the uneven pattern portion 150 disposed on the overcoat layer 140 of the pattern formation area PFA, the anode electrode AEg can include a morphology that follows a surface morphology of the uneven pattern portion 150.

Since each of the self-light emitting device SED and the cathode electrode CE of the green light emission portion EPg is substantially the same as each of the self-light emitting device SED and the cathode electrode CE of the red light emission portion EPr disposed in the first subpixel area SPA1, and its repetitive description will be omitted.

The green light emission portion EPg can have a size greater than that of the light output area LOA. Also, based on a color temperature to be implemented in the light emitting display apparatus or the second subpixel 12*b*, the green light emission portion EPg can have a size greater than the alpha light emission portion EPα and smaller than the red and blue light emission portions EPr and EPb when the alpha light emission portion EPα of the second subpixel area SPA2 among the light emission portions EPr, EPw, EPα, EPb and EPg of the first to fourth subpixel areas SPA1 to SPA4 has the smallest size, or can have a size between the alpha light emission portion EPα and the red light emission portion EPr when the alpha light emission portion EPα has a middle size and the red light emission portion EPr has the smallest size. According to one embodiment, the green light emission portion EPg having the uneven pattern portion 150 can have a luminance increase rate of 30% in comparison with the green light emission portion according to the comparison example having no uneven pattern portion. Therefore, the size of the green light emission portion EPg can be set within the range that can increase a color temperature of the second subpixel area SPA2 based on the luminance increase rate due to the uneven pattern portion 150.

The bank pattern 160 defines the green light emission portion EPg of the fourth subpixel area SPA4, and can be implemented to cover (or overlay) the edge portion of the anode electrode AEg, the edge portion of the uneven pattern portion 150, and the non-pattern portion 140*a* of the overcoat layer 140. The bank pattern 160 can be disposed on each of the (4i)th data line DL4*i* and the (2j)th pixel driving voltage line PL2*j*.

According to one embodiment, the bank pattern 160 disposed on the (4i)th data line DL4*i* can cover (or overlay) the entire at least one concave portion 153 of the uneven pattern portion 150 disposed on the (4i)th data line DL4*i*. For example, a first end 160*e*1 of the bank pattern 160 disposed on the (4i)th data line DL4*i* can be arranged on an outer concave portion 153*a* adjacent to the first outmost concave portion 153*o*1 of the plurality of concave portions 153 disposed in the uneven pattern portion 150 on the (4i)th data line DL4*i*. For example, the first end 160*e*1 of the bank pattern 160 can be arranged on an inclined surface between a bottom surface of the outer concave portion 153*a* and a peak portion of the convex portion 151 adjacent to the outer concave portion 153*a*, and can be overlapped with the (4i)th data line DL4*i*.

According to one embodiment, the bank pattern 160 disposed on the (2j)th pixel driving voltage line PL2*j* can cover (or overlay) a portion of the uneven pattern portion 150 disposed on the (2j)th pixel driving voltage line PL2*j*. For example, a second end 160*e*2 of the bank pattern 160 disposed on the (2j)th pixel driving voltage line PL2*j* can be arranged on a second outmost concave portion 153*o*2 of the plurality of concave portions 153 disposed in the uneven pattern portion 150 on the (2j)th pixel driving voltage line PL2*j*. For example, the second end 160*e*2 of the bank pattern 160 can be arranged on an inclined surface between a bottom surface of the second outmost concave portion 153*o*2 and a peak portion of the convex portion 151 adjacent to the second outmost concave portion 153*o*2, and can be overlapped with the edge portion of the (2j)th pixel driving voltage line PL2*j*.

The bank pattern 160 can reduce a step difference (or a stepped portion) at the boundary portion between the uneven pattern portion 150 and the overcoat layer 140 by covering (or overlaying) the edge portion of the uneven pattern portion 150. As a result, electric contact (or short) between the anode electrode AEg and the cathode electrode CE due to a thickness reduction of the self-light emitting device SED, which is generated at the boundary portion between the uneven pattern portion 150 and the overcoat layer 140 by the height of the bank pattern 160, can be prevented by the bank pattern 160.

Figure 9:
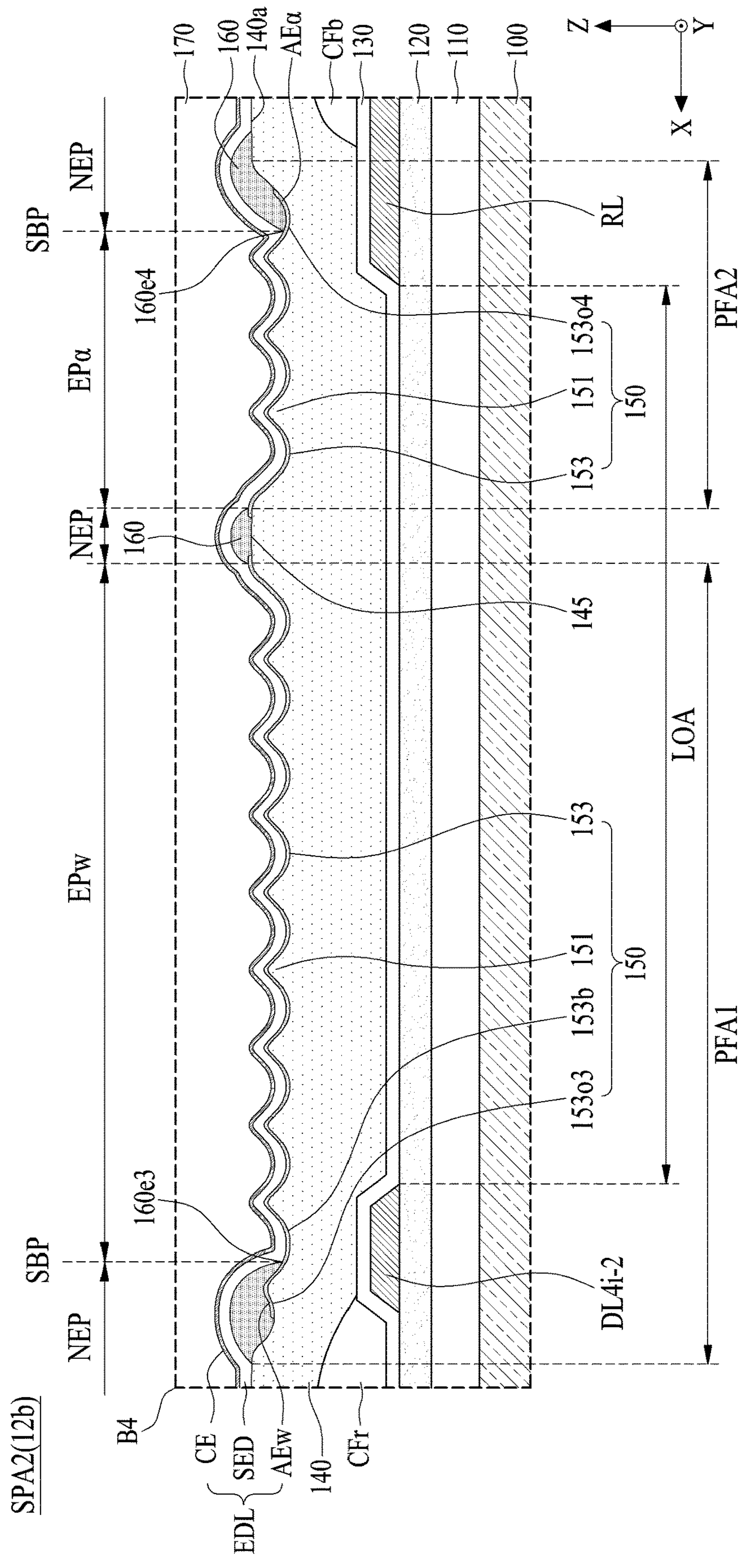
FIG. 9 is an enlarged view of a region 'B4' shown in FIG. 3.

FIG. 9 is an enlarged view of a portion 'B4' shown in FIG. 3 for illustrating a second subpixel area according to the first embodiment of the present disclosure.

Referring to FIGS. 2, 3 and 9, the second subpixel area SPA4 (or the second subpixel 12*b*) according to the first embodiment of the present disclosure can include a light output area LOA corresponding between the (4i-2)th data line DL4*i*-2 and the reference voltage line RL, first and second pattern formation areas PFA1 and PFA2 corresponding to the uneven pattern portion 150, first and second light emission portions EPw and EPα defined by the bank pattern 160.

The light output area LOA can be disposed between the (4i-2)th data line DL4*i*-2 and the reference voltage line RL, which are disposed in the first area A1 of the second subpixel area SPA2.

The first pattern formation area PFA1 can be defined as an area where the first light emission portion EPw among the first area A1 of the second subpixel area SPA2 is disposed. The first pattern formation area PFA1 can be defined as an area lower than the non-pattern portion (or the uppermost surface) 140*a* among the area of the overcoat layer 140 disposed on the first light emission portion EPw of the second subpixel area SPA2. An edge portion of one side of the first pattern formation area PFA1 can be disposed on the (4i-2)th data line DL4*i*-2. For example, an end at one side of the first pattern formation area PFA1 disposed on the (4i-2)th data line DL4*i*-2 can be disposed between the (4i-3)th data line DL4*i*-3 and the (4i-2)th data line DL4*i*-2. An end at the other side of the first pattern formation area PFA1 can be disposed on the light output area LOA.

The second pattern formation area PFA2 can be defined as an area where the second light emission portion EPα among the first area A1 of the second subpixel area SPA2 is disposed. The second pattern formation area PFA2 can be defined as an area lower than the non-pattern portion (or the uppermost surface) 140*a* among the area of the overcoat layer 140 disposed on the second light emission portion EPα of the second subpixel area SPA2. The second pattern formation area PFA2 can have a size relatively smaller than that of the first pattern formation area PFA1. An edge portion of the other side of the second pattern formation area PFA2 can be disposed on the reference voltage line RL. For example, an end at one side of the second pattern formation area PFA2 disposed on the reference voltage line RL can be disposed on the reference voltage line RL. An end at the other side of the second pattern formation area PFA2 can be disposed on the light output area LOA.

The overcoat layer 140 disposed on the second subpixel area SPA2 can include a subpixel separation portion (or non-pattern portion) 145 disposed between the first pattern formation area PFA1 and the second pattern formation area PFA2.

The subpixel separation portion 145 can be implemented in the overcoat layer 140 between the first light emission portion EPw and the second light emission portion EPα. The subpixel separation portion 145 can include a flat surface (or non-pattern portion) of the overcoat layer 140 disposed between the first light emission portion EPw and the second light emission portion EPα. For example, the subpixel separation portion 145 can be comprised of a flat surface arranged on the same plane as the uppermost surface 140*a* of the overcoat layer 140. For example, the subpixel separation portion 145 can have a width of several hundreds of nanometers to several hundreds of micrometers.

The first light emission portion EPw can include a light emitting device layer EDL disposed on the uneven pattern portion 150 of the first pattern formation area PFA1. The light emitting device layer EDL can include a first anode electrode AEw, a self-light emitting device SED and a cathode electrode CE.

The first anode electrode AEw can have a size smaller than that of the first pattern formation area PFA1. For example, in the second subpixel area SPA2, the formation area of the first anode electrode AEw can have a size smaller than that of the first pattern formation area PFA1. According to one embodiment, an end at one side of the first anode electrode AEw can be arranged on the outmost concave portion 153*o* disposed on the (4i-2)th data line DL4*i*-2, and an end at the other side of the first anode electrode AEw can be arranged on an edge portion at one side of the subpixel separation portion 145. For example, the end at one side of the first anode electrode AEw can be arranged on the bottom surface of the outmost concave portion 153*o*. Since the first anode electrode AEw is directly in contact with the uneven pattern portion 150 disposed on the overcoat layer 140 of the first pattern formation area PFA1, the first anode electrode AEw can include a morphology that follows a surface morphology of the uneven pattern portion 150.

Since each of the self-light emitting device SED and the cathode electrode CE of the first light emission portion EPw is substantially the same as each of the self-light emitting device SED and the cathode electrode CE of the red light emission portion EPr disposed in the first subpixel area SPA1, and its repetitive description will be omitted.

The first light emission portion EPw can have the greatest size among the light emission portions EPr, EPw, EPα, EPb and EPg of the first to fourth subpixel areas SPA1 to SPA4 based on a color temperature to be implemented in the light emitting display apparatus or the second subpixel 12*b*. The size of the first light emission portion EPw having the uneven pattern portion 150 can be set within the range that can increase a color temperature and white luminance to be implemented in the light emitting display apparatus or the second subpixel 12*b*.

The second light emission portion EPα can include a light emitting device layer EDL disposed on the uneven pattern portion 150 of the second pattern formation area PFA2. The light emitting device layer EDL can include a second anode electrode AEα, a self-light emitting device SED and a cathode electrode CE.

The second anode electrode AEα can have a size smaller than that of the second pattern formation area PFA2. For example, in the second subpixel area SPA2, the formation area of the second anode electrode AEα can have a size smaller than that of the second pattern formation area PFA2. According to one embodiment, an end at one side of the second anode electrode AEα can be arranged on the edge portion at the other side of the subpixel separation portion 145, and an end at the other side of the second anode electrode AEα can be arranged on the outmost concave portion 153*o*4 disposed on the reference voltage line RL. For example, the end at the other of the second anode electrode AEα can be arranged on the inclined surface between the bottom surface of the outmost concave portion 153*o*4 and the non-pattern portion 140*a* of the overcoat layer 140. Since the second anode electrode AEα is directly in contact with the uneven pattern portion 150 disposed on the overcoat layer 140 of the second pattern formation area PFA2, the second anode electrode AEα can include a morphology that follows a surface morphology of the uneven pattern portion 150.

Since each of the self-light emitting device SED and the cathode electrode CE of the second light emission portion EPα is substantially the same as each of the self-light emitting device SED and the cathode electrode CE of the red light emission portion EPr disposed in the first subpixel area SPA1, and its repetitive description will be omitted.

The second light emission portion EPα can have a middle size or the smallest size among the light emission portions EPr, EPw, EPα, EPb and EPg of the first to fourth subpixel areas SPA1 to SPA4 based on a color temperature to be implemented in the light emitting display apparatus or the second subpixel 12*b*. For example, the second light emission portion EPα can have a middle size when the red light emission portion EPr among of the light emission portions EPr, EPw, EPα, EPb and EPg of the first to fourth subpixel areas SPA1 to SPA4 has the smallest size. The size of the second light emission portion EPα having the uneven pattern portion 150 can be set within the range that can increase a color temperature and white luminance to be implemented in the light emitting display apparatus or the second subpixel 12*b*.

The first light emission portion EPw and the second light emission portion EPα can simultaneously be supplied with the same data current from the driving transistor Tdr of the corresponding pixel circuit PC to emit light at the same time. In the second subpixel area SPA2, the first light emission portion EPw can serve as a main light emission portion, and the second light emission portion EPα can serve as an auxiliary light emission portion. Therefore, in comparison with one light emission portion disposed in the second subpixel area according to the comparison example, as driving stress (or degradation) applied to the first light emission portion EPw is dispersed to the second light emission portion EPα, driving stress of the first light emission portion EPw serving as the main light emission portion can be reduced, whereby lifetime of the light emitting device layer EDL disposed in the first light emission portion EPw can be extended.

The bank pattern 160 can define the first light emission portion EPw and the second light emission portion EPα of the second subpixel area SPA2.

The bank pattern 160 can be implemented to cover (or overlay) the edge portion of the first and second anode electrodes AEw and AEα, the edge portion of the uneven pattern portion 150, and the non-pattern portion 140*a* of the overcoat layer 140. The bank pattern 160 can be disposed on each of the (4i-2)th data line DL**4*i*-2** and the reference voltage line RL.

According to one embodiment, the bank pattern 160 disposed on the (4i-2)th data line DL**4*i*-2 can cover (or overlay) the entire at least one concave portion 153 of the uneven pattern portion 150 disposed on the (4i-2)th data line DL4*i*-2. For example, an end 160*e*3 at one side of the bank pattern 160 disposed on the (4i-2)th data line DL4*i*-2 can be arranged on an outer concave portion 153*b* adjacent to the outmost concave portion 153*o*3 of the plurality of concave portions 153 disposed in the uneven pattern portion 150 on the (4i-2)th data line DL4*i*-2. For example, the end 160*e*3 at one side of the bank pattern 160 can be arranged on an inclined surface between a bottom surface of an outer concave portion 153*b* and a peak portion of the convex portion 151 adjacent to the outer concave portion 153*b*, and can be overlapped with the (4i-2)th data line DL4*i*-2**.

According to one embodiment, the bank pattern 160 disposed on the reference voltage line RL can cover (or overlay) a portion of the uneven pattern portion 150 disposed on the reference voltage line RL. For example, an end **160*e*4 at the other side of the bank pattern 160 disposed on the reference voltage line RL can be arranged on a fourth outmost concave portion 153*o*4 of the plurality of concave portions 153 disposed in the uneven pattern portion 150 on the reference voltage line RL. For example, the end 160*e*4 at the other side of the bank pattern 160 can be arranged on an inclined surface between a bottom surface of the fourth outmost concave portion 153*o*4 and a peak portion of the convex portion 151 adjacent to the fourth outmost concave portion 153*o*4**, and can be overlapped with the reference voltage line RL.

The bank pattern 160 can reduce a step difference (or a stepped portion) at the boundary portion between the uneven pattern portion 150 and the overcoat layer 140 by covering (or overlaying) the edge portion of the uneven pattern portion 150 disposed in the second subpixel area SPA2. As a result, electric contact (or short) between each of the first and second anode electrodes AEw and AEα and the cathode electrode CE due to a thickness reduction of the self-light emitting device SED, which is generated at the boundary portion between the uneven pattern portion 150 and the overcoat layer 140 by the height of the bank pattern 160, can be prevented by the bank pattern 160.

As described above, as the light emitting display apparatus according to one embodiment of the present disclosure can include the second subpixel area SPA2 having the first light emission portion EPw and the second light emission portion EPα, which are spatially separated from each other while having their respective sizes different from each other, luminance and color temperature of a display image can be improved by light emitted from each of the first light emission portion EPw and the second light emission portion EPα. For example, according to one embodiment of the present disclosure, at least one among the light emission portions EP of the first, third and fourth subpixel areas SPA1, SPA3 and SPA4 can have a size reduced in accordance with the size of the second light emission portion EPα, whereby luminance of at least one of red, green and blue can be reduced, and as a result white luminance and color temperature can be increased.

Also, as the light emitting display apparatus according to one embodiment of the present disclosure can include the uneven pattern portion 150 disposed in the light emission portions EP of the subpixel areas SPA1 to SPA4, even though a size of at least one among the light emission portions EP of the first, third and fourth subpixel areas SPA1, SPA3 and SPA4 is reduced by the second light emission portion EPα, luminance of at least one of red, green and blue can be increased by increase of light extraction efficiency based on the uneven pattern portion 150, whereby white luminance and color temperature can be increased.

Figure 10:
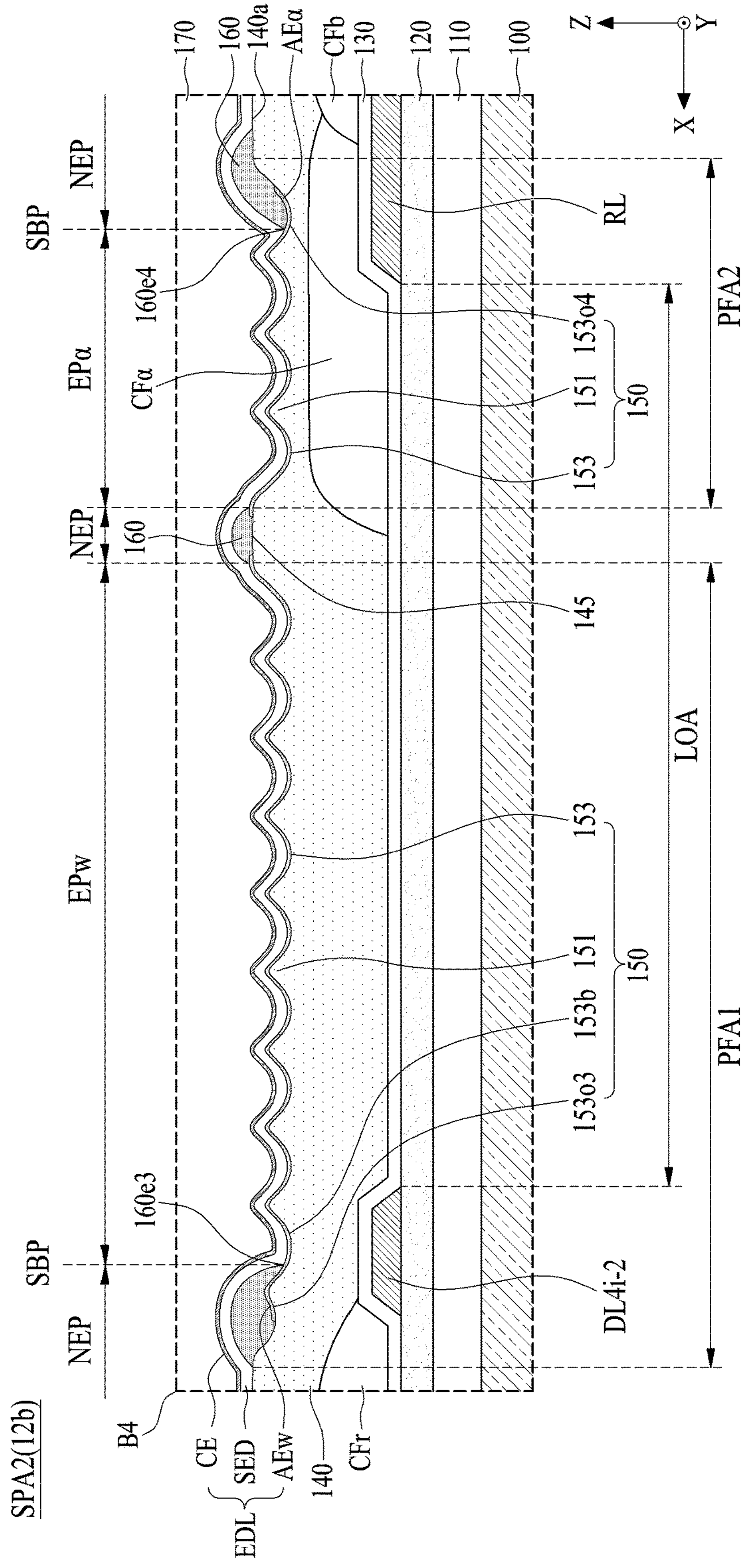
FIG. 10 is another example of an enlarged view of a region 'B4' shown in FIG. 3.

FIG. 10 is an enlarged view of a portion 'B4' shown in FIG. 3 for illustrating a second subpixel area according to the second embodiment of the present disclosure, wherein an alpha color filter is additionally provided in the second light emission portion shown in FIG. 9. Therefore, in the following description, the alpha color filter and its related elements will be described, and the same reference numerals as those of FIG. 9 will be given to the other elements and their repetitive descriptions are omitted or will be briefly described below.

Referring to FIGS. 2, 3 and 10, the second subpixel area SPA2 (or the second subpixel **12*b*) according to the second embodiment of the present disclosure substantially has the same structure as that of the second subpixel area SPA2 shown in FIG. 9** except that the alpha color filter CFα is further disposed in the second light emission portion EPα.

The second light emission portion EPα can be implemented to emit non-white light. To this end, the second light emission portion EPα can include an alpha color filter CFα. For example, the alpha color filter CFα can be understood as additional color filter or auxiliary color filter.

The alpha color filter CFα can be disposed below the uneven pattern portion 150 disposed in the second pattern formation area PFA2. For example, the alpha color filter CFα can be provided between the substrate 100 and the overcoat layer 140 to overlap the second light emission portion EPα. For example, the alpha color filter CFα can be interposed between the overcoat layer 140 and the passivation layer 130 overlapped with the second light emission portion EPα. Therefore, as the second light emission portion EPα can include the uneven pattern portion 150 and the alpha color filter CFα, the second light emission portion EPα can have a light extraction structure different from that of the first light emission portion EPw including the uneven pattern portion 150.

The alpha color filter CFα can have a size greater than or wider than that of the second light emission portion EPα. For example, an end of the alpha color filter CFα can be extended to overlap the non-light emission portion NEP adjacent thereto by passing through the subpixel boundary portion SPB between the subpixel areas SPA1 to SPA4. Additionally, the end of the alpha color filter CFα adjacent to the third subpixel area SPA3 can cover or overlap the edge portion of a blue color filter CFb disposed in the third subpixel area SPA3 of the non-light emission portion NEP. The overlapped (or stacked) portion of the alpha color filter CFα and the blue color filter CFb can serve as a light-shielding layer that minimizes or prevents light leakage and color mixture between the second subpixel 12*b* and the third subpixel 12*c*.

The alpha color filter CFα according to one embodiment can include a blue color filter or a red color filter.

According to one embodiment, the alpha color filter CFα can include a blue color filter. In this case, the alpha color filter CFα including the blue color filter can be made more cool the spectrum of white light emitted from the second subpixel area SPA2 by filtering white light emitted from the second light emission portion EPα as blue light. For example, the alpha color filter CFα including a blue color filter can be applied when the light emitting display apparatus or the second subpixel 12*b* can be implemented a color temperature of 10000K.

According to another embodiment, the alpha color filter CFα can include a red color filter. In this case, the alpha color filter CFα that includes the red color filter can filter white light emitted from the second light emission portion EPα as red light. For example, the alpha color filter CFα including a red color filter can be applied when the light emitting display apparatus or the second subpixel 12*b* can be implemented a color temperature of 6500K.

When the alpha color filter CFα includes the blue color filter, blue light can be extracted (or outputted) toward the substrate 100 through the second light emission portion EPα. In this case, contribution of the third subpixel area SPA3 that uses a fluorescent material can be reduced, whereby driving stress (or degradation) applied to the third subpixel 12*c* can be reduced. For this reason, lifetime of the third subpixel 12*c* emitting blue light can be extended.

Selectively, the alpha color filter CFα can further include at least one of a quantum dot and a long wavelength absorption material (or dye). As the quantum dot can have a size emitting light of a color set in the alpha color filter CFα, the quantum dot can re-emit light in accordance with white light emitted from the light emitting device layer ELD to the substrate 100, whereby a color reproduction rate can be increased. The long wavelength absorption material can absorb at least a portion of light of a long wavelength to reduce light transmittance (or light extraction rate) of a long wavelength area, thereby increasing a color temperature. For example, the long wavelength absorption material can be implemented to absorb a wavelength of 620 nm to 700 nm.

As the light emitting display apparatus that includes the second subpixel 12*b* according to the second embodiment of the present disclosure can further include the alpha color filter CFα disposed in the second light emission portion EPα of the second subpixel 12*b*, white luminance and color temperature can be more increased than the light emitting display apparatus that includes the second subpixel 12*b* shown in FIG. 9, and lifetime of each of red, green and blue subpixels can be extended.

Figure 11:
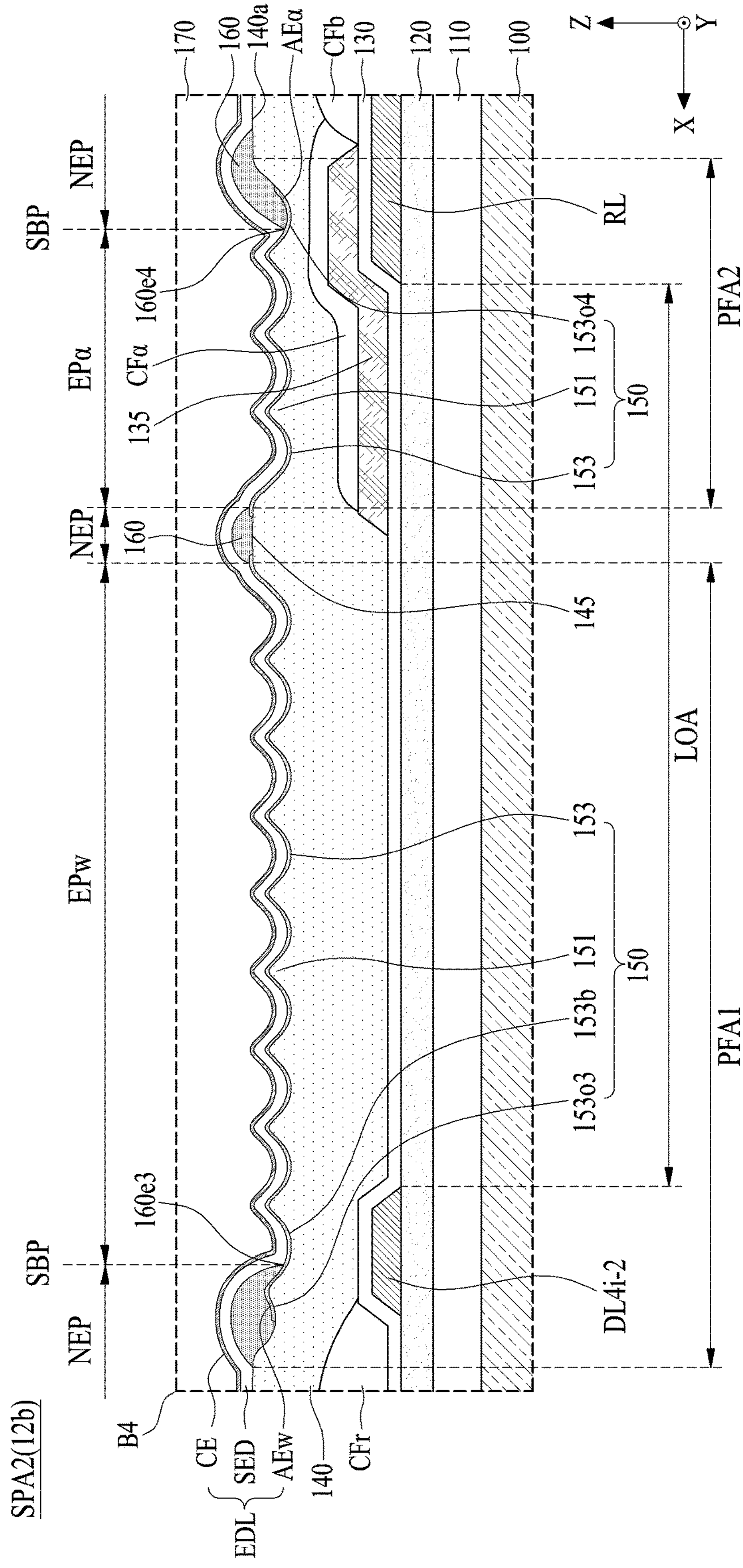
FIG. 11 is another example of an enlarged view of a region 'B4' shown in FIG. 3.
Figure 12:
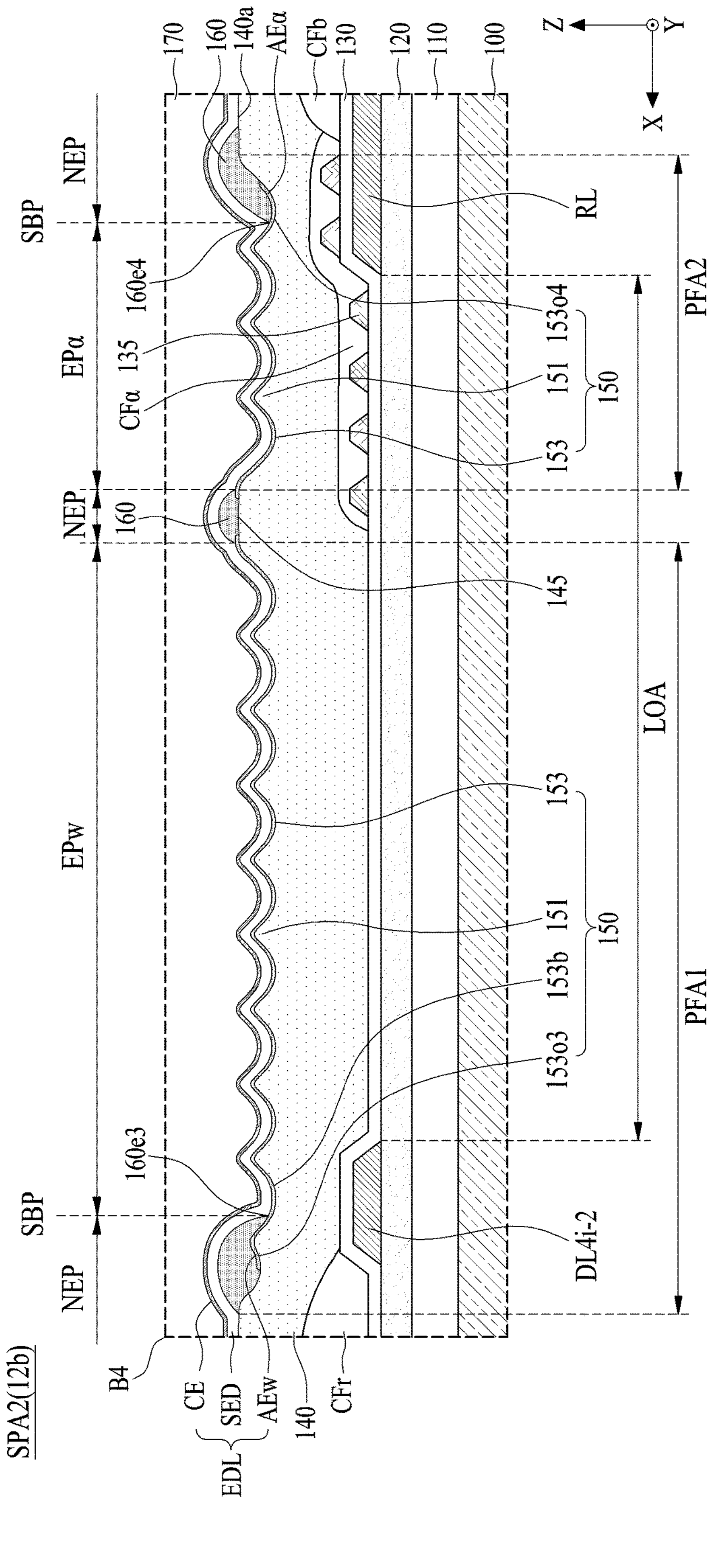
FIG. 12 is a view illustrating a modified example of an island pattern layer shown in FIG. 11.

FIG. 11 is an enlarged view of a portion 'B4' shown in FIG. 3 for illustrating a second subpixel area according to the third embodiment of the present disclosure, and FIG. 12 is a view illustrating a modified example of an island pattern layer shown in FIG. 11, wherein an island pattern layer is additionally provided in the second light emission portion shown in FIG. 10. Therefore, in the following description, the island pattern layer and its related elements will be described, and the same reference numerals as those of FIG. 10 will be given to the other elements and their repetitive descriptions are omitted or will be briefly described below.

Referring to FIGS. 2, 3, 11 and 12, the second subpixel area SPA2 (or the second subpixel 12*b*) according to the third embodiment of the present disclosure substantially has the same structure as that of the second subpixel area SPA2 shown in FIG. 11 except that the island pattern layer 135 is further disposed in the second light emission portion EPα.

The island pattern layer 135 can be implemented between the passivation layer 130 and the alpha color filter CFα. A formation area of the island pattern layer 135 can have a size greater than that of the second anode electrode AEα. For example, the formation area of the island pattern layer 135 can have a size equal to or greater than that of the uneven pattern portion 150 disposed in the second light emission portion EPα. Therefore, as the second light emission portion EPα can include the uneven pattern portion 150, the alpha color filter CFα and the island pattern layer 135, the second light emission portion EPα can have a light extraction structure different from that of the first light emission portion EPw.

The island pattern layer 135 according to one embodiment can be disposed in the entire area of the second light emission portion EPα. The size of the island pattern layer 135 can have a size greater than that of the second anode electrode AEα. The size of the island pattern layer 135 can be equal to or greater than that of the uneven pattern portion 150 disposed in the second light emission portion EPα.

The island pattern layer 135 according to another embodiment, as shown in FIG. 12, can include a plurality of patterns spaced apart from one another. The plurality of patterns can have a line shape, a dot shape or a random shape.

The alpha color filter CFα can be disposed between the island pattern layer 135 and the uneven pattern portion 150. The alpha color filter CFα can be thinner than color filters CFr, CFb and CFg disposed in different subpixel areas. For example, the alpha color filter CFα can be thinner than the color filters CFr, CFb and CFg disposed in different subpixel areas in accordance with a thickness of the island pattern layer 135. Therefore, the thickness of the island pattern layer 135 can be set in accordance with transmittance of the alpha color filter CFα based on white luminance and/or color temperature to be implemented in the light emitting display apparatus or the second subpixel 12*b*.

As described above, the light emitting display apparatus that includes the second subpixel 12*b* according to the third embodiment of the present disclosure can have the same effects as those of the light emitting display apparatus that includes the second subpixel 12*b* shown in FIG. 10. Also, the light emitting display apparatus according to this embodiment can reduce the thickness of the alpha color filter CFα through the island pattern layer 135, whereby transmittance of the second light emission portion EPα can be controlled or increased.

Figure 13:
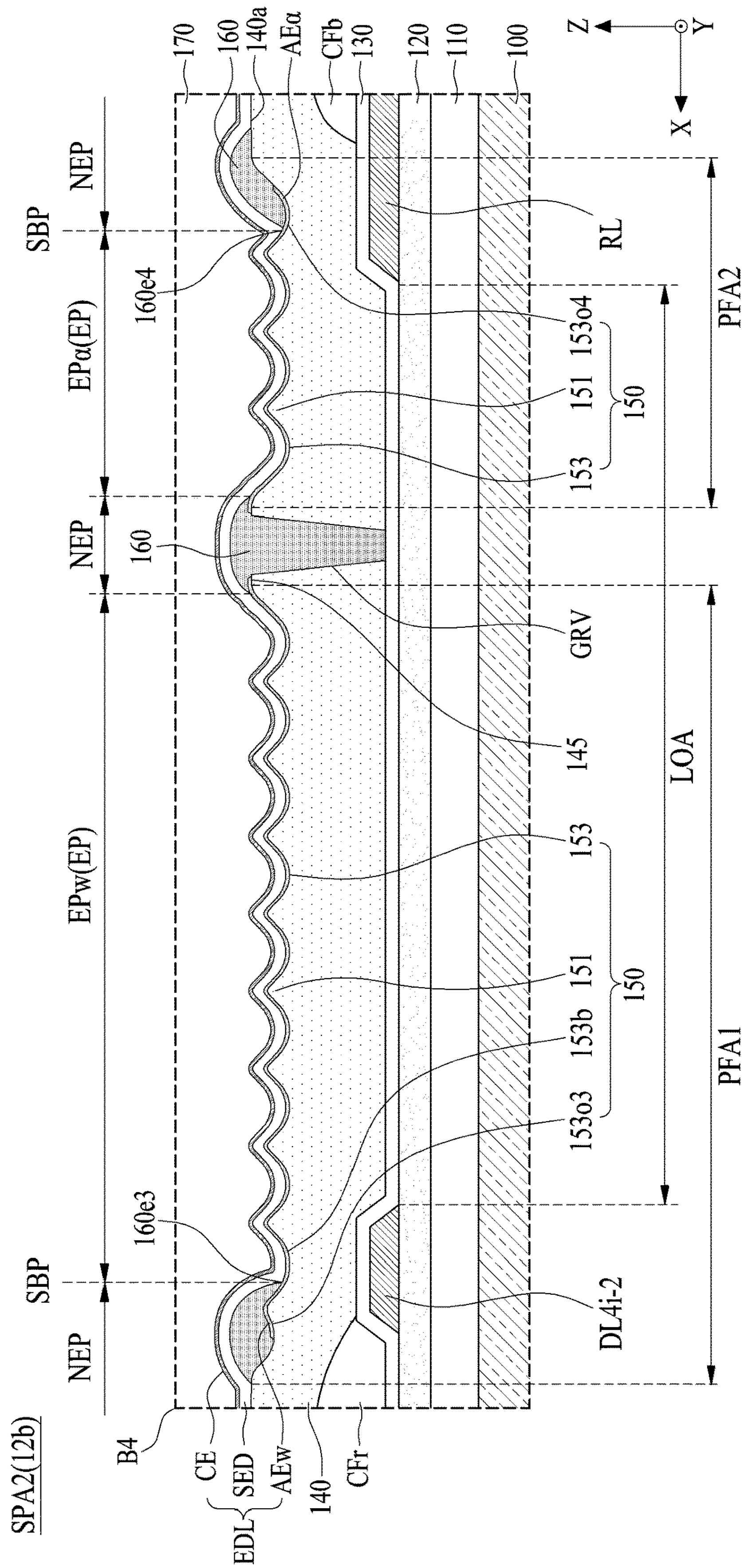
FIG. 13 is another example of an enlarged view of a region 'B4' shown in FIG. 3.

FIG. 13 is an enlarged view of a portion 'B4' shown in FIG. 3 for illustrating a second subpixel area according to the fourth embodiment of the present disclosure, wherein a groove pattern is additionally provided in the second subpixel area shown in FIG. 9. Therefore, in the following description, the groove pattern and its related elements will be described, and the same reference numerals as those of FIG. 9 will be given to the other elements and their repetitive descriptions are omitted or will be briefly described below.

Referring to FIGS. 2, 3 and 13, the second subpixel area SPA2 (or the second subpixel 12*b*) according to the fourth embodiment of the present disclosure substantially has the same structure as that of the second subpixel area SPA2 shown in FIG. 9 except that the groove pattern GRV is further disposed between the first light emission portion EPw and the second light emission portion EPα.

The groove pattern GRV can be implemented in the overcoat layer 140 between the first light emission portion EPw and the second light emission portion EPα. The groove pattern GRV can be implemented to be recessed from the subpixel separation portion 145 or the flat surface disposed between the first light emission portion EPw and the second light emission portion EPα.

The groove pattern GRV can have a width of several hundreds of nanometers to several hundreds of micrometers, and can have the same depth as the thickness of the overcoat layer 140 or a depth smaller than the thickness of the overcoat layer 140. A shortest distance between the substrate 100 and the groove pattern GRV can be shorter than the distance between the concave portion 153 of the uneven pattern portion 150 and the substrate 100, which are respectively disposed in the first light emission portion EPw and the second light emission portion EPα. The bottom surface of the groove pattern GRV can be arranged between the upper surface of the passivation layer 130 and the bottom surface of the concave portion 153. For example, when the groove pattern GRV can have the same depth as the thickness of the overcoat layer 140, the bottom surface of the groove pattern GRV can be the upper surface of the passivation layer 130.

As the groove pattern GRV can include an inclined surface between the first light emission portions EPw and the second light emission portion EPα, the groove pattern GRV can partially reflect some of incident light from each of the first light emission portion EPw and the second light emission portion EPα toward the substrate 100.

The groove pattern GRV according to this embodiment can be covered (or overlaid) by the bank pattern 160.

The bank pattern 160 can be filled in the groove pattern GRV by covering (or overlaying) the edge portion of each of the first and second anode electrodes AEw and AEα disposed between the first light emission portion EPw and the second light emission portion EPα. For example, the bank pattern 160 can be formed of a photoresist that includes a black dye, and therefore can serve as a light-shielding member that prevents a color mixture between the first and second light emission portions EPw and EPα from occurring. In this case, the bank pattern 160 can spatially completely separate the first light emission portion EPw and the second light emission portion EPα to each other, thereby increasing light extraction efficiency in each of the first light emission portion EPw and the second light emission portion EPα.

As described above, the light emitting display apparatus that includes the second subpixel 12*b* according to the fourth embodiment of the present disclosure can have the same effects as those of the light emitting display apparatus that includes the second subpixel 12*b* shown in FIG. 9. Also, in the light emitting display apparatus according to this embodiment, a color mixture between the first light emission portion EPw and the second light emission portion EPα can be prevented by the groove pattern GRV, whereby white luminance and color temperature can be increased.

Additionally, the second light emission portion EPα of the second subpixel area SPA2 (or the second subpixel 12*b*) according to the fourth embodiment of the present disclosure can further include the alpha color filter CFα shown in FIG. 10, or can further include the island pattern layer 135 and the alpha color filter CFα shown in FIG. 11 or 12. For example, the second light emission portion EPα can further include the alpha color filter CFα shown in FIG. 10, or can further include the island pattern layer 135 and the alpha color filter CFα shown in FIG. 11.

Figure 14:
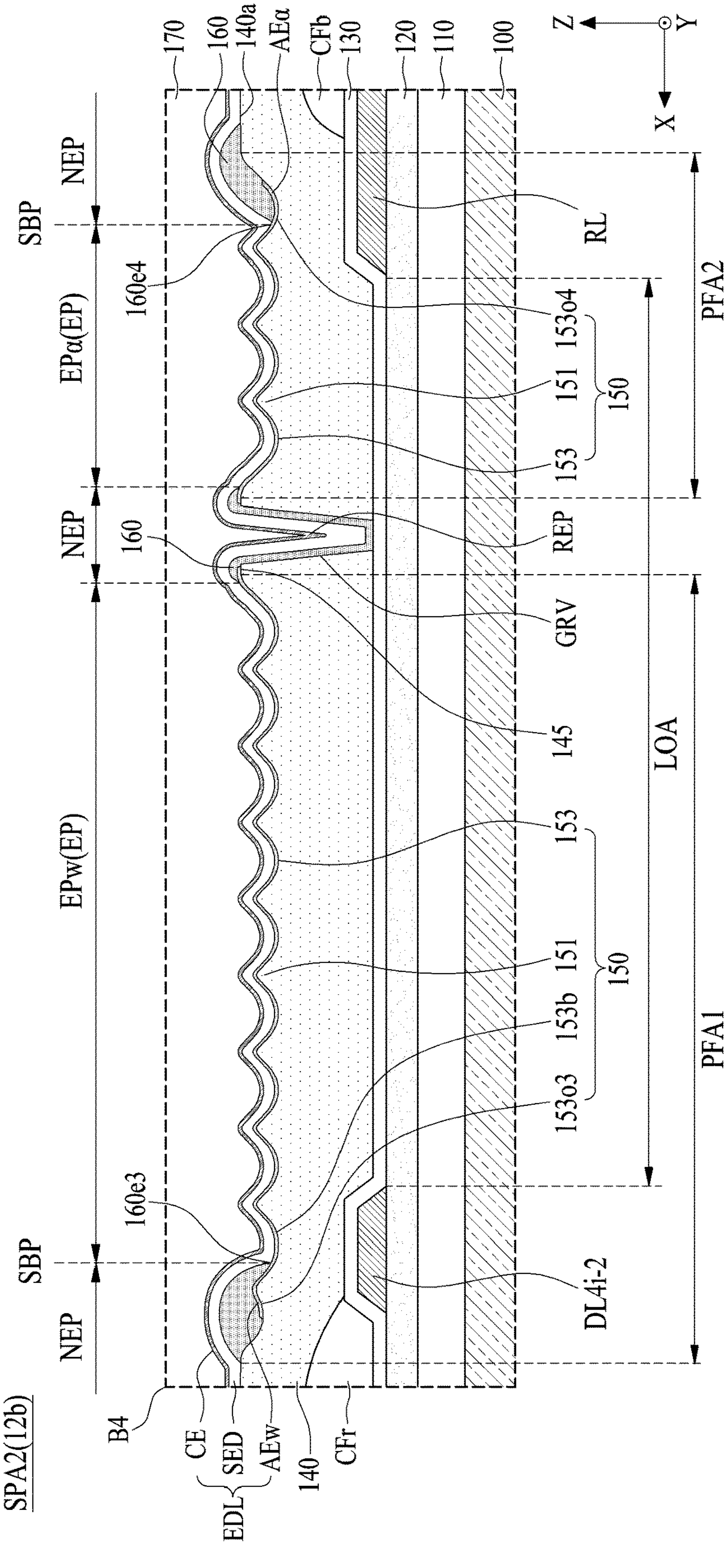
FIG. 14 is another example of an enlarged view of a region 'B4' shown in FIG. 3.

FIG. 14 is an enlarged view of a portion 'B4' shown in FIG. 3 for illustrating a second subpixel area according to the fifth embodiment of the present disclosure, wherein the structures of the bank pattern and the cathode electrode, which are disposed in the second subpixel area shown in FIG. 13 are modified. Therefore, in the following description, the bank pattern and the cathode electrode and their related elements will be described, and the same reference numerals as those of FIG. 13 will be given to the other elements and their repetitive descriptions are omitted or will be briefly described below.

Referring to FIGS. 2, 3 and 14, in the second subpixel area SPA2 (or the second subpixel 12*b*) according to the fifth embodiment of the present disclosure, the light emission portion EP can include a reflective electrode portion REP disposed on the groove pattern GRV disposed between the first light emission portion EPw and the second light emission portion EPα.

Since the groove pattern GRV is substantially the same as the groove pattern GRV shown in FIG. 13, and its repetitive description will be omitted The bank pattern 160 disposed on the groove pattern GRV can be implemented to correspond to the shape of the groove pattern GRV while covering (or overlaying) the edge portion of each of the first and second anode electrodes AEw and AEα disposed in the non-light emission portion NEP between the first light emission portion EPw and the second light emission portion EPα.

According to one embodiment, the bank pattern 160 on the groove pattern GRV can be formed to have a relatively thin thickness along an inclined surface of the groove pattern GRV. For example, the bank pattern 160 on the groove pattern GRV can be formed to cover (or overlay) the inclined surface and the bottom surface of the groove pattern GRV without being filled in the entire grove pattern GRV. Therefore, the bank pattern 160 on the groove pattern GRV can include a groove portion corresponding to the shape of the groove pattern GRV. For example, the bank pattern 160 on the groove pattern GRV can include an inclined surface, a bottom surface, and a "U"-shaped groove portion surrounded by the inclined surface and the bottom surface.

The bank pattern 160 can be made of a transparent material, but is not limited, can be formed of a photoresist that includes a black dye. Alternatively, the bank pattern 160 on the groove pattern GRV can be made of a material different from that of the bank pattern 160 on the non-light emission portion NEP between the subpixel areas SPA1 to SPA4. For example, the bank pattern 160 can be entirely formed of a photoresist that includes a black dye, and only the bank pattern 160 on the groove pattern GRV can be made of a transparent material.

The self-light emitting device SED of the light emitting device layer EDL can be implemented to have a morphology that follows a surface morphology of the first and second anode electrodes AEw and AEα and the second bank pattern 160.

In the self-light emitting device SED disposed on the groove pattern GRV, the self-light emitting device SED can be formed to cover (or overlay) the inclined surface and the groove portion of the bank pattern 160. For example, the self-light emitting device SED can be formed to cover (or overlay) the inclined surface and the bottom surface of the bank pattern 160 without being fully filled in the bank pattern 160. Therefore, the self-light emitting device SED can include the groove portion corresponding to the shape of the groove pattern GRV. For example, the self-light emitting device SED can include the inclined surface, the bottom surface, and the "U"-shaped groove portion surrounded by the inclined surface and the bottom surface.

The cathode electrode CE can be implemented to have a morphology that follows the surface morphology of the self-light emitting device SED. At this time, the cathode electrode CE disposed on the groove pattern GRV can include a groove portion corresponding to the shape of the groove pattern GRV. For example, the cathode electrode CE can include an inclined surface and a "V" or "U"-shaped groove portion surrounded by the inclined surface. The groove portion of the cathode electrode CE can serve as a reflective electrode portion REP.

A shortest distance between the substrate 100 and the cathode electrode CE disposed on the groove pattern GRV can be shorter than the distance between the concave portion 153 of the uneven pattern portion 150 and the substrate 100, which are respectively disposed in the first light emission portion EPw and the second light emission portion EPα. The bottom surface of the cathode electrode CE disposed on the groove pattern GRV can be arranged between the upper surface of the passivation layer 130 and the bottom surface of the concave portion 153. The cathode electrode CE disposed on the groove pattern GRV can serve as a reflective panel that reflects incident light from each of the first light emission portion EPw and the second light emission portion EPα toward the substrate 100 to spatially completely separate the first light emission portion EPw and the second light emission portion EPα to each other, whereby light extraction efficiency in each of the first light emission portion EPw and the second light emission portion EPα can be increased.

As described above, the light emitting display apparatus that includes the second subpixel 12*b* according to the fifth embodiment of the present disclosure can have the same effects as those of the light emitting display apparatus that includes the second subpixel 12*b* shown in FIG. 13. Also, in the light emitting display apparatus according to this embodiment, light extraction efficiency in each of the first light emission portion EPw and the second light emission portion EPα can be increased in accordance with reflection of light by the cathode electrode disposed on the groove pattern GRV, whereby white luminance and color temperature can be increased.

Additionally, the second light emission portion EPα of the second subpixel area SPA2 (or the second subpixel 12*b*) according to the fifth embodiment of the present disclosure can further include the alpha color filter CFα shown in FIG. 10, or can further include the island pattern layer 135 and the alpha color filter CFα shown in FIG. 11 or 12. For example, the second light emission portion EPα can further include the alpha color filter CFα shown in FIG. 10, or can further include the island pattern layer 135 and the alpha color filter CFα shown in FIG. 11.

Figure 15:
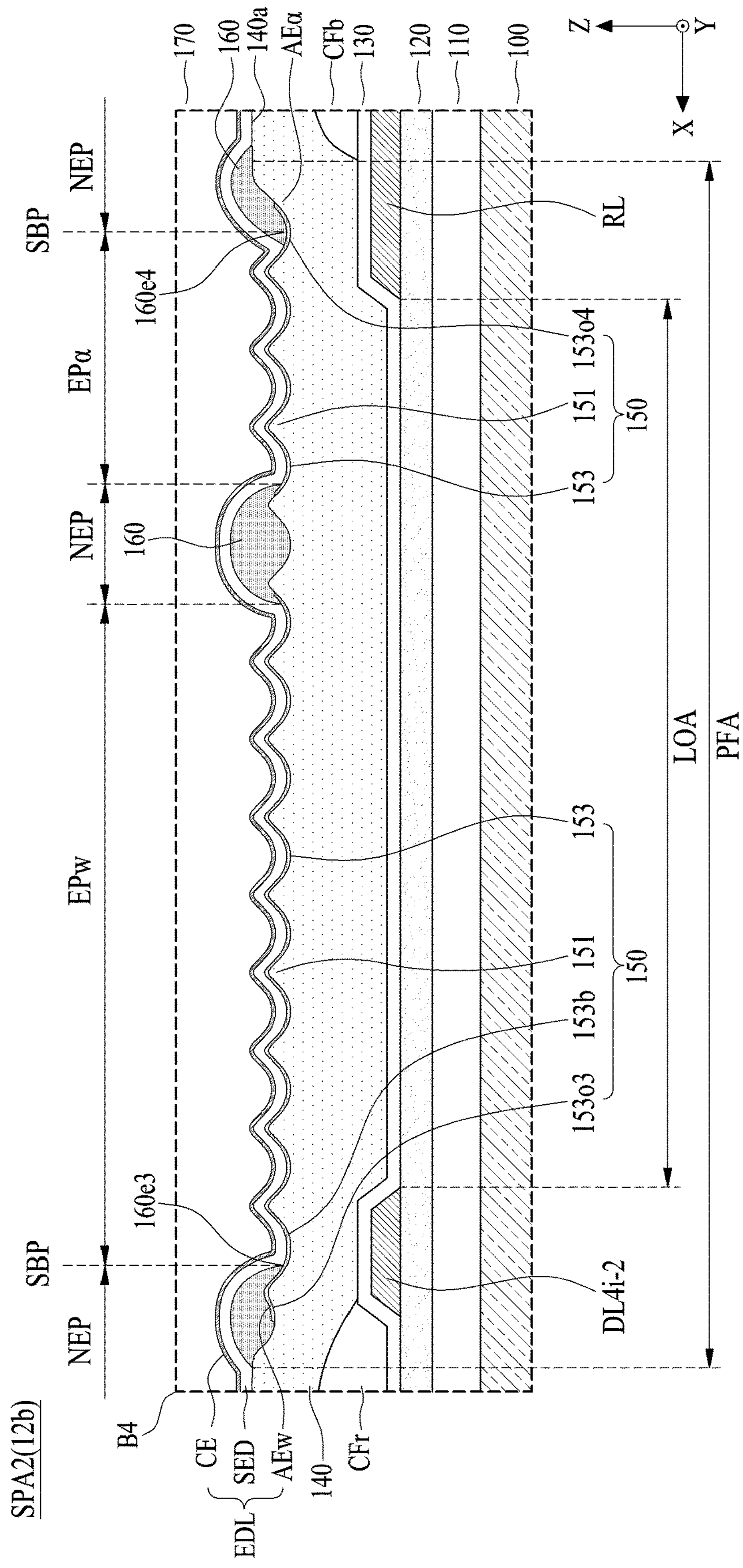
FIG. 15 is another example of an enlarged view of a region 'B4' shown in FIG. 3.

FIG. 15 is an enlarged view of a portion 'B4' shown in FIG. 3 for illustrating a second subpixel area according to the sixth embodiment of the present disclosure, wherein the uneven pattern portion disposed in the second subpixel area shown in FIG. 9 is modified. Therefore, in the following description, the uneven pattern portion and its related elements will be described, and the same reference numerals as those of FIG. 9 will be given to the other elements and their repetitive descriptions are omitted or will be briefly described below.

Referring to FIGS. 2, 3 and 15, the second subpixel area SPA2 (or the second subpixel 12*b*) according to the sixth embodiment of the present disclosure substantially has the same structure as that of the second subpixel area SPA2 shown in FIG. 9 except that the uneven pattern portion 150 is additionally disposed on the overcoat layer 140 between the first light emission portion EPw and the second light emission portion EPα.

The uneven pattern portion 150 can be additionally implemented on the overcoat layer 140 between the first light emission portion EPw and the second light emission portion EPα. Therefore, the second subpixel area SPA2 can have one pattern formation area PFA where the uneven pattern portion 150 is formed.

One pattern formation area PFA can have a size greater than that of the light output area LOA corresponding between the (4i-2)th data line DL4*i*-2 and the reference voltage line RL, which are disposed in the first area A1 of the second subpixel area SPA2.

In the bank pattern 160 disposed between the first light emission portion EPw and the second light emission portion EPα, the bank pattern 160 can cover (or overlay) at least one convex portion 151 of the uneven pattern portion 150 and the edge portion of each of the first and second anode electrodes AEw and AEα disposed in the non-light emission portion NEP between the first light emission portion EPw and the second light emission portion EPα. Both ends of the bank pattern 160 can be arranged in the concave portion of the uneven pattern portion 150, at which the edge portion of each of the first and second anode electrodes AEw and AEα is disposed. This bank pattern 160 can reduce a step difference (or a stepped portion) at the boundary portion between the uneven pattern portion 150 and the overcoat layer 140 by covering (or overlaying) the edge portion of the uneven pattern portion 150 disposed between the first light emission portion EPw and the second light emission portion EPα. As a result, electric contact (or short) between each of the first anode electrode AEw and the second anode electrode AEα and the cathode electrode CE due to a thickness reduction of the self-light emitting device SED, which is generated at the boundary portion between the uneven pattern portion 150 and the overcoat layer 140 by the height of the bank pattern 160, can be prevented by the bank pattern 160.

As described above, the light emitting display apparatus that includes the second subpixel 12*b* according to the sixth embodiment of the present disclosure can have the same effects as those of the light emitting display apparatus that includes the second subpixel 12*b* shown in FIG. 9. Also, as the light emitting display apparatus according to this embodiment includes the uneven pattern portion 150 disposed on the overcoat layer 140 between the first light emission portion EPw and the second light emission portion EPα, electric contact (or short) between each of the first and second anode electrodes AEw and AEα and the cathode electrode CE can be prevented from occurring between the first light emission portion EPw and the second light emission portion EPα due to the height of the bank pattern 160.

Additionally, the second light emission portion EPα of the second subpixel area SPA2 (or the second subpixel 12*b*) according to the sixth embodiment of the present disclosure can further include the alpha color filter CFα shown in FIG. 10, or can further include the island pattern layer 135 and the alpha color filter CFα shown in FIG. 11 or 12. For example, the second light emission portion EPα can further include the alpha color filter CFα shown in FIG. 10, or can further include the island pattern layer 135 and the alpha color filter CFα shown in FIG. 11.

Figure 16:
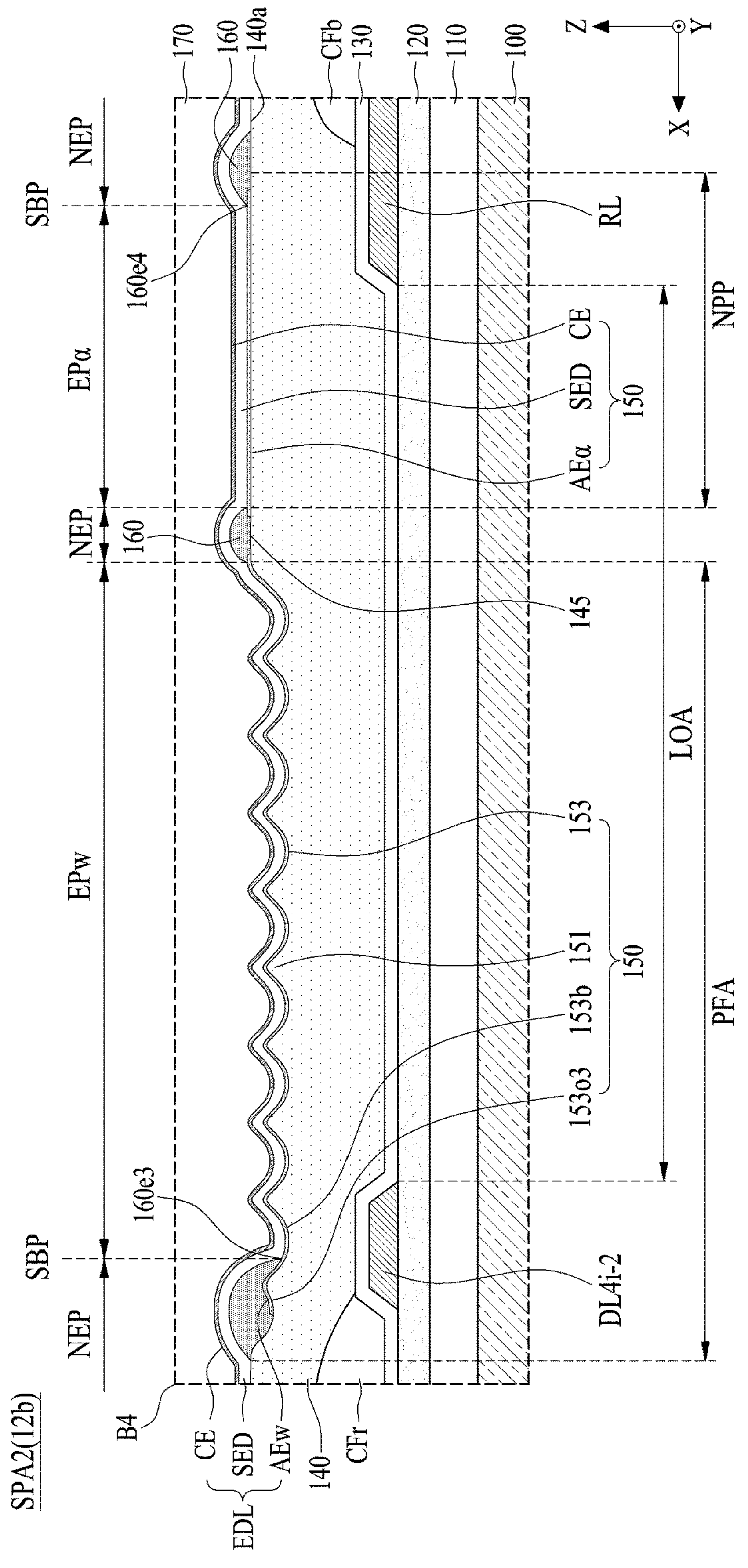
FIG. 16 is another example of an enlarged view of a region 'B4' shown in FIG. 3.

FIG. 16 is an enlarged view of a portion 'B4' shown in FIG. 3 for illustrating a second subpixel area according to the seventh embodiment of the present disclosure, wherein the non-pattern portion is provided in the overcoat layer disposed in the second light emission portion of the second subpixel area shown in FIG. 9. Therefore, in the following description, the non-pattern portion of the second light emission portion and its related elements will be described, and the same reference numerals as those of FIG. 9 will be given to the other elements and their repetitive descriptions are omitted or will be briefly described below.

Referring to FIGS. 2, 3 and 16, the second subpixel area SPA2 (or the second subpixel 12*b*) according to the seventh embodiment of the present disclosure substantially has the same structure as that of the second subpixel area SPA2 shown in FIG. 9 except that the uneven pattern portion 150 disposed on the overcoat layer 140 of the second light emission portion EPα is changed to the non-pattern portion NPP.

The overcoat layer 140 disposed in the second subpixel area SPA2 can include the uneven pattern portion 150 disposed in the first light emission portion EPw and the non-pattern portion NPP disposed in the second light emission portion EPα. The non-pattern portion NPP can an area where the uneven pattern portion 150 is not formed in the overcoat layer 140 disposed on the second light emitting portion EPα, and can be understood as a flat portion or a flat surface. For example, as the non-pattern portion NPP is masked by a mask pattern so that the uneven pattern portion 150 is not formed when the uneven panel portion 150 is formed in the light emission portion of the other subpixel areas SPA1 to SPA4, whereby the non-pattern portion NPP can be implemented in a substantially flat surface shape.

As the second light emission portion EPα includes the non-pattern portion NPP without the uneven pattern portion 150, the second light emission portion EPα can have a light extraction structure different from that of the first light emission portion EPw including the uneven pattern portion 150. Also, the second light emission portion EPα can have a surface shape different from that of the first light emission portion EPw. For example, the first light emission portion EPw can have a surface shape of an uneven shape (or embossed shape) due to the uneven pattern portion 150, and the second light emission portion EPα can have a flat surface shape.

The light emitting device layer EDL disposed on the non-pattern portion NPP can be implemented in a flat surface structure that follows a surface morphology of the non-pattern portion NPP. For example, each of the second anode electrode AEα, the self-light emitting device SED and the cathode electrode CE of the light emitting device layer EDL disposed in the non-pattern portion NPP can be formed in a flat structure including a flat surface. Therefore, the second anode electrode AEα can have a surface morphology different from that of the first anode electrode AEw. For example, the second anode electrode AEα can have a surface morphology of a flat shape. On the other hand, the first anode electrode AEw can have a surface morphology of an uneven shape (or embossed shape) due to the uneven pattern portion 150. Therefore, the light emitting device layer EDL disposed in the second light emission portion EPα can have a light extraction structure or surface morphology, which is different from the light emitting device layer EDL disposed in the first light emission portion EPw. For example, the light emitting device layer EDL disposed in the second light emission portion EPα can have a surface morphology of a flat surface shape due to the non-pattern portion NPP, and the light emitting device layer EDL disposed in the first light emission portion EPw can have a surface morphology of an uneven shape (or embossed shape) due to the uneven pattern portion 150.

As the second light emission portion EPα of the second subpixel 12*b* includes the non-pattern portion NPP, a light leakage phenomenon in which light leakage components from each of the first light emission portion EPw and the third subpixel area SPA3 adjacent thereto are extracted (or outputted) toward the substrate 100 can be prevented. For example, when the uneven pattern portion 150 is arranged in the second light emission portion EPα, the light leakage phenomenon in which light leakage components generated from the first light emission portion EPw and/or the subpixel area adjacent thereto are extracted (or outputted) toward the substrate 100 by the uneven pattern portion 150 can occur. However, in this embodiment, the second light emission portion EPα of the second subpixel 12*b* includes the non-pattern portion NPP that does not include the uneven pattern portion 150, whereby the light leakage phenomenon can be prevented.

As described above, the light emitting display apparatus that includes the second subpixel 12*b* according to the seventh embodiment of the present disclosure can have the same effects as those of the light emitting display apparatus that includes the second subpixel 12*b* shown in FIG. 9. Also, as the light emitting display apparatus according to this embodiment includes the non-pattern portion NPP disposed in the second light emission portion EPα, the light leakage phenomenon in which light leakage components from the subpixel area adjacent thereto are extracted (or outputted) toward the substrate 100 can be prevented, whereby white luminance and color temperature can be more increased.

Additionally, the second light emission portion EPα of the second subpixel area SPA2 (or the second subpixel 12*b*) according to the seventh embodiment of the present disclosure can further include the alpha color filter CFα shown in FIG. 10, or can further include the island pattern layer 135 and the alpha color filter CFα shown in FIG. 11 or 12. For example, the second light emission portion EPα can further include the alpha color filter CFα shown in FIG. 10, or can further include the island pattern layer 135 and the alpha color filter CFα shown in FIG. 11.

Also, the second subpixel area SPA2 (or the second subpixel 12*b*) according to the seventh embodiment of the present disclosure can further include the groove pattern GRV shown in FIG. 13 or 14.

Figure 17:
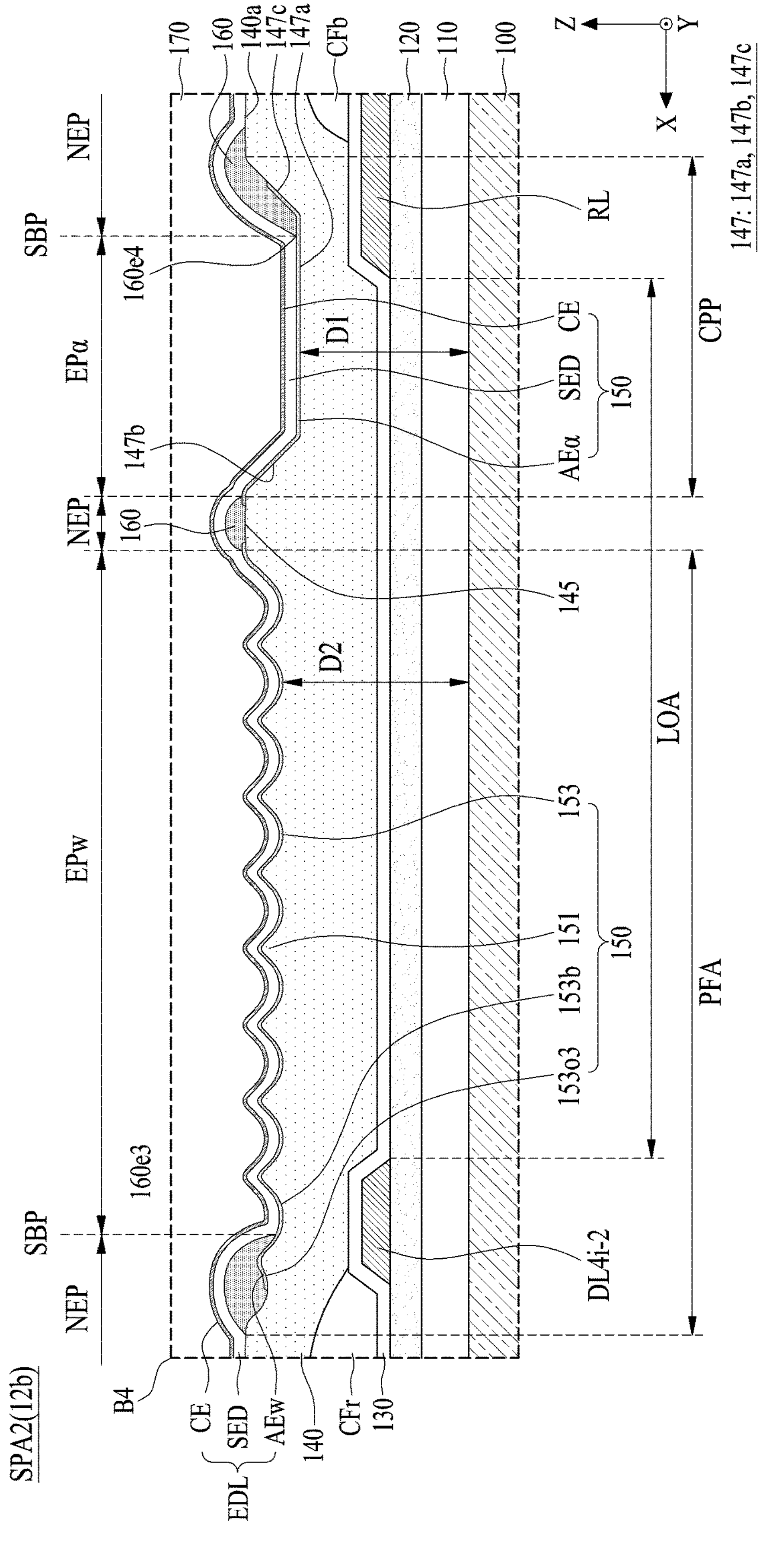
FIG. 17 is another example of an enlarged view of a region 'B4' shown in FIG. 3.

FIG. 17 is an enlarged view of a portion 'B4' shown in FIG. 3 for illustrating a second subpixel area according to the eighth embodiment of the present disclosure, wherein a concave pattern portion is provided in the overcoat layer disposed in the second light emission portion of the second subpixel area shown in FIG. 9. Therefore, in the following description, the concave pattern portion of the second light emission portion and its related elements will be described, and the same reference numerals as those of FIG. 9 will be given to the other elements and their repetitive descriptions are omitted or will be briefly described below.

Referring to FIGS. 2, 3 and 17, the second subpixel area SPA2 (or the second subpixel 12*b*) according to the eighth embodiment of the present disclosure substantially has the same structure as that of the second subpixel area SPA2 shown in FIG. 9 except that the uneven pattern portion disposed on the overcoat layer 140 of the second light emission portion EPα is modified to a concave pattern portion CPP.

The overcoat layer 140 disposed in the second subpixel area SPA2 can include an uneven pattern portion 150 disposed in the first light emission portion EPw and a concave pattern portion CPP disposed in the second light emission portion EPα. Therefore, as the second light emission portion EPα includes the concave pattern portion CPP without the uneven pattern portion 150, the second light emission portion EPα can have a light extraction structure different from that of the first light emission portion EPw that includes the uneven pattern portion 150. Also, the second light emission portion EPα can have a surface morphology different from that of the first light emission portion EPw. For example, the first light emission portion EPw can have a surface morphology of an uneven shape (or embossed shape) due to the uneven pattern portion 150, and the second light emission portion EPα can have a surface morphology of a concave shape due to the concave pattern portion CPP.

The concave pattern portion CPP can include a concave pattern 147 embodied to be recessed from the overcoat layer disposed on the second light emission portion EPα. The concave pattern 147 can be formed to be recessed from the non-pattern portion (or the uppermost surface) 140*a* of the overcoat layer 140 toward the substrate 100.

The concave pattern 147 according to one embodiment can include a bottom surface 147*a*, a first inclined surface 147*b*, and a second inclined surface 147*b*.

The bottom surface 147*a* of the concave pattern 147 can be provided on the second light emission portion EPα in a substantially flat structure. The bottom surface 147*a* of the concave pattern 147 according to one embodiment can be disposed to be closer to the substrate 100 than the uppermost surface of the uneven pattern portion 150 disposed in the first light emission portion EPw and spaced apart from the upper surface of the passivation layer 130.

The first and second inclined surfaces 147*b* and 147*c* of the concave pattern 147 can be implemented to be inclined between the bottom surface 147*a* of the concave pattern 147 and the non-pattern portion 140*a* of the overcoat layer 140. For example, an included angle between each of the first and second inclined surfaces 147*b* and 147*c* and the bottom surface 147*a* can be 90° to 135°.

Each of the first and second inclined surfaces 147*b* and 147*c* of the concave pattern 147 can reflect light leakage components from each of the first light emission portion EPw and the third subpixel area SPA3 adjacent thereto, and therefore can prevent the light leakage components from being extracted toward the substrate 100 through the second light emission portion EPα. To this end, a shortest distance D1 between the bottom surface 147*a* of the concave pattern 147 and the substrate 100 can be shorter than a shortest distance D2 between the substrate 100 and the concave portion 153 of the uneven pattern portion 150 disposed in the first light emission portion EPw. For example, the bottom surface 147*a* of the concave pattern 147 can be arranged among the substrate 100, the concave portion 153 and the passivation layer 130.

The light emitting device layer EDL disposed on the concave pattern portion CPP can be implemented in a concave structure corresponding to the surface morphology of the concave pattern portion CPP. For example, each of the second anode electrode AEα, the self-light emitting device SED and the cathode electrode CE of the light emitting device layer EDL disposed in the concave pattern portion CPP can be formed in a concave structure that includes a bottom surface and an inclined surface. Therefore, the second anode electrode AEα can have a surface morphology different from that of the first anode electrode AEw. For example, the second anode electrode AEα can have a surface morphology of a concave shape due to the concave pattern portion CPP. On the other hand, the first anode electrode AEw can have a surface morphology of an uneven shape (or embossed shape) due to the uneven pattern portion 150. Therefore, the light emitting device layer EDL disposed in the second light emission portion EPα can have a light extraction structure or surface morphology, which is different from the light emitting device layer EDL disposed in the first light emission portion EPw. For example, the light emitting device layer EDL disposed in the second light emission portion EPα can have a surface morphology of a flat surface shape due to the concave pattern portion CPP, and the light emitting device layer EDL disposed in the first light emission portion EPw can have a surface morphology of an uneven shape (or embossed shape) due to the uneven pattern portion 150.

As the second light emission portion EPα of the second subpixel 12*b* includes the concave pattern portion CPP, the light leakage phenomenon in which light leakage components from each of the first light emission portion EPw and the third subpixel area SPA3 adjacent thereto are extracted (or outputted) toward the substrate 100 can be prevented. For example, when the uneven pattern portion 150 is disposed in the second light emission portion EPα, the light leakage phenomenon in which light leakage components generated from the first light emission portion EPw and/or the subpixel area adjacent thereto are extracted (or outputted) toward the substrate 100 by the uneven pattern portion 150 can occur. However, in this embodiment, the second light emission portion EPα of the second subpixel 12*b* includes the first and second inclined surfaces 147*b* and 147*c* of the concave pattern 147 disposed in the concave pattern portion CPP, whereby the light leakage phenomenon can be prevented.

As described above, the light emitting display apparatus that includes the second subpixel 12*b* according to the eighth embodiment of the present disclosure can have the same effects as those of the light emitting display apparatus that includes the second subpixel 12*b* shown in FIG. 9. Also, as the light emitting display apparatus according to this embodiment includes the concave pattern portion CPP disposed in the second light emission portion EPα, the light leakage phenomenon in which light leakage components from the subpixel area adjacent thereto are extracted (or outputted) toward the substrate 100 can be prevented, whereby white luminance and color temperature can be more increased.

Additionally, the second light emission portion EPα of the second subpixel area SPA2 (or the second subpixel 12*b*) according to the eighth embodiment of the present disclosure can further include the alpha color filter CFα shown in FIG. 10, or can further include the island pattern layer 135 and the alpha color filter CFα shown in FIG. 11 or 12. For example, the second light emission portion EPα can further include the alpha color filter CFα shown in FIG. 10, or can further include the island pattern layer 135 and the alpha color filter CFα shown in FIG. 11.

Also, the second subpixel area SPA2 (or the second subpixel 12*b*) according to the eighth embodiment of the present disclosure can further include the groove pattern GRV shown in FIG. 13 or 14.

Figure 18A:
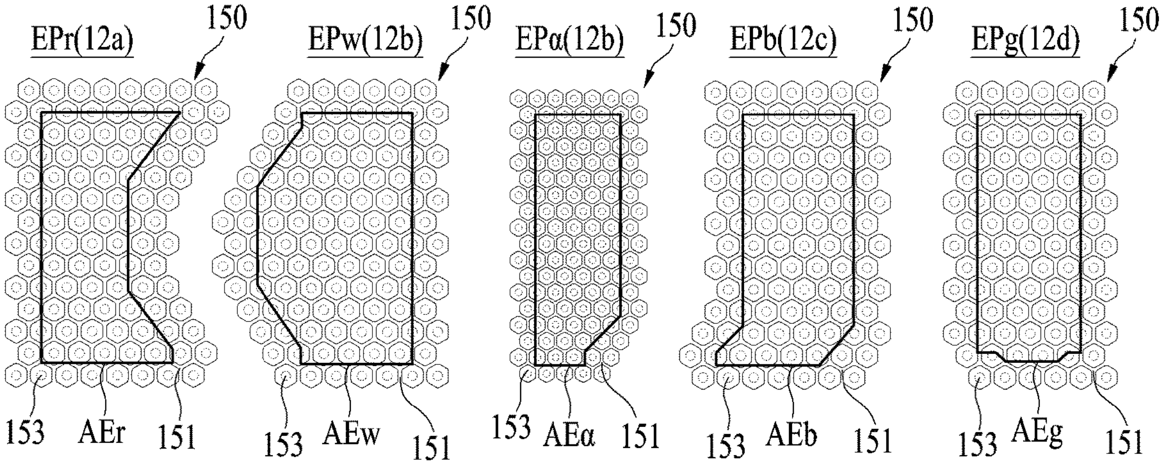
FIGS. 18A and 18B are views illustrating various examples of the uneven pattern portion shown in FIG. 3.
Figure 18B:
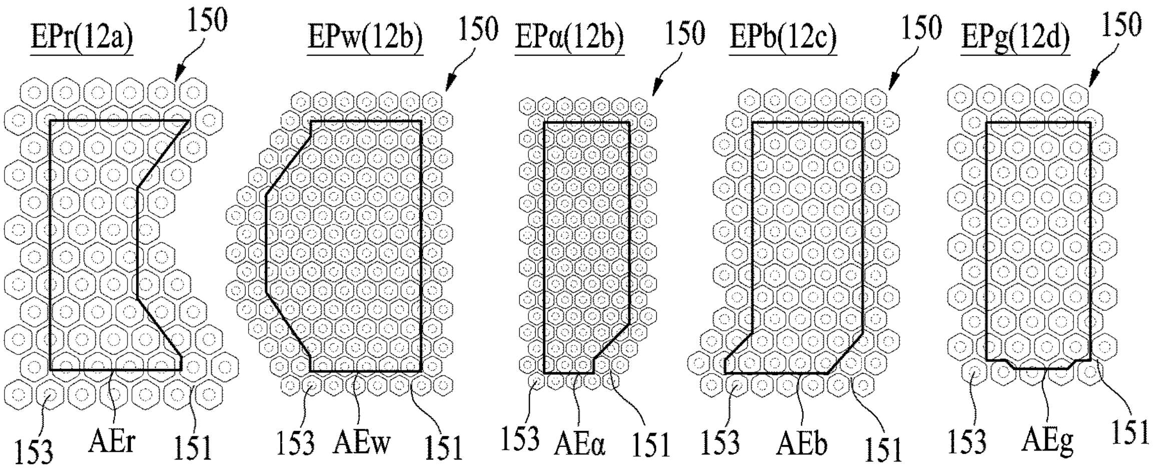

FIGS. 18A and 18B are views illustrating various examples of the uneven pattern portion shown in FIG. 3.

Referring to FIG. 18A, the uneven pattern portion 150 according to the first embodiment can have a size wider or greater than that of each of the anode electrodes AEr, AEw, AEα, AEb and AEg respectively disposed in the light emission portions EPr, EPw, EPα, EPb and EPg of the first to fourth subpixels 12*a*, 12*b*, 12*c* and 12*d*.

The uneven pattern portions 150 disposed in the light emission portions EPr, EPb and EPg of the first, third and fourth subpixels 12*a*, 12*c* and 12*d* can be embodied in the same structure. Therefore, the light emitting device layer disposed in the light emission portions EPr, EPb and EPg of the first, third and fourth subpixels 12*a*, 12*c* and 12*d* can have a surface morphology of an uneven shape (or embossed shape) due to the uneven pattern portion 150.

The uneven pattern portions 150 disposed in the first light emission portion EPw and the second light emission portion EPα of the second subpixel 12*b* can be implemented in different structures or different shapes. The first light emission portion EPw and the second light emission portion EPα can have light extraction structures different from each other due to the uneven pattern portions 150 having different structures or different shapes. Therefore, the light emitting device layers disposed in the first light emission portion EPw and the second light emission portion EPα can have surface morphologies different from each other due to the uneven pattern portions 150 having different structures or different shapes.

Also, the first anode electrode AEw and the second anode electrode AEα respectively disposed in the first light emission portion EPw and the second light emission portion EPα can have surface morphologies different from each other due to the uneven pattern portions 150 having different structures or different shapes. Therefore, the light emitting device layers disposed in the first light emission portion EPw and the second light emission portion EPα can have surface morphologies different from each other.

The convex portion 151 of the uneven pattern portion 150 disposed in the first light emission portion EPw and the convex portion 151 of the uneven pattern portion 150 disposed in the second light emission portion EPα can be different from each other in at least one of a diameter, a height, a half-height, a width, a spaced distance between the concave portions 153, a slope and an aspect ratio.

According to one embodiment, the convex portion 151 of the second light emission portion EPα and the convex portion 151 of the first light emission portion EPw can have diameters different from each other. The convex portion 151 of the second light emission portion EPα can have a diameter smaller than or greater than that of the convex portion 151 of the first light emission portion EPw. For example, a bottom diameter of the convex portion 151 of the second light emission portion EPα can be set to 0.5 to 1.5 times of a bottom diameter of the convex portion 151 of the first light emission portion EPw.

According to another embodiment, the convex portion 151 of the second light emission portion EPα and the convex portion 151 of the first light emission portion EPw can have heights different from each other. The convex portion 151 of the second light emission portion EPα can have a height lower than or higher than that of the convex portion 151 of the first light emission portion EPw. For example, the height of the convex portion 151 of the second light emission portion EPα can be set to 0.5 to 1.5 times of the height of the convex portion 151 of the first light emission portion EPw.

According to other embodiment, based on a unit area, the number of the concave portions 153 of the second light emission portion EPα can be different from the number of the concave portions 153 of the first light emission portion EPw. The second light emission portions EPα per unit area can have the concave portions 153 more than or smaller than those of the first light emission portions EPw. For example, the number of the concave portions 153 of the second light emission portion EPα can be set to 0.5 to 1.5 times of the number of the concave portions 153 of the first light emission portion EPw.

As described above, the uneven pattern portion 150 according to the first embodiment can be implemented in the first light emission portion EPw and the second light emission portion EPα in different structure or different shapes to optimize light extraction efficiency of the second light emission portions EPα, whereby white luminance and color temperature of the second subpixel 12*b* can be improved or optimized. For example, when the color temperature of the second light emission portion EPα is increased, the convex portion 151 of the second light emission portion EPα can have a greater diameter or higher height than the convex portion 151 of the first light emission portion EPw.

Referring to FIG. 18B, the uneven pattern portion 150 according to the second embodiment can be implemented in the light emission portions EPr, EPw, EPα, EPb and EPg of the first to fourth subpixels 12*a*, 12*b*, 12*c* and 12*d* in different structure or different shapes. For example, the uneven pattern portion 150 according to the second embodiment can be implemented in the light emission portions EPr, EPw, EPα, EPb and EPg of the first to fourth subpixels 12*a*, 12*b*, 12*c* and 12*d* in different structure or different shapes based on white luminance and color temperature to be implemented in the light emitting display apparatus. Therefore, the light emitting device layers disposed in the light emission portions EPr, EPw, EPα, EPb and EPg of the first to fourth subpixels 12*a*, 12*b*, 12*c* and 12*d* can have surface morphologies of different uneven shapes (or different embossed shapes) due to the uneven pattern portions 150 having different structures or different shapes.

The convex portions 151 of the uneven pattern portions 150 disposed in the light emission portions EPr, EPw, EPα, EPb and EPg of the first to fourth subpixels 12*a*, 12*b*, 12*c* and 12*d* can be different from one another in at least one of a diameter, a height, a half-height, a width, a spaced distance between the concave portions 153, a slope and an aspect ratio.

According to one embodiment, the bottom diameter of the convex portion 151 disposed in the uneven pattern portion 150 can have sizes in the order (EPr>EPg>EPb>EPw>EPα) of the red light emission portion EPr, the green light emission portion EPg, the blue light emission portion EPb, the first light emission portion EPw, and the second light emission portion EPα. At this time, the bottom diameter of the convex portion 151 of the second light emission portion EPα can be set to 0.5 to 1.5 times of the bottom diameter of the convex portion 151 of the first light emission portion EPw.

According to another embodiment, the height of the convex portion 151 disposed in the uneven pattern portion 150 can have sizes in the order (EPr>EPg>EPb>EPw>EPα) of the red light emission portion EPr, the green light emission portion EPg, the blue light emission portion EPb, the first light emission portion EPw, and the second light emission portion EPα. At this time, the height of the convex portion 151 of the second light emission portion EPα can be set to 0.5 to 1.5 times of the height of the convex portion 151 of the first light emission portion EPw.

According to other embodiment, based on the unit area, the number of the concave portions 153 disposed in the uneven pattern portion 150 can be provided in the order (EPα>EPw>EPb>EPg>EPr) of the second light emission portion EPα, the first light emission portion EPw, the blue light emission portion EPb, the green light emission portion EPg, and the red light emission portion EPr. At this time, the number of the concave portions 153 of the second light emission portion EPα can be set to 0.5 to 1.5 times of the number of the concave portions 153 of the first light emission portion EPw.

As described above, the uneven pattern portion 150 according to the second embodiment can be implemented in the light emission portions EPr, EPw, EPα, EPb and EPg of the first to fourth subpixels 12*a*, 12*b*, 12*c* and 12*d* in different structure or different shapes, whereby white luminance and color temperature of the unit pixel or the light emitting display apparatus can be improved or optimized.

Figure 19A:
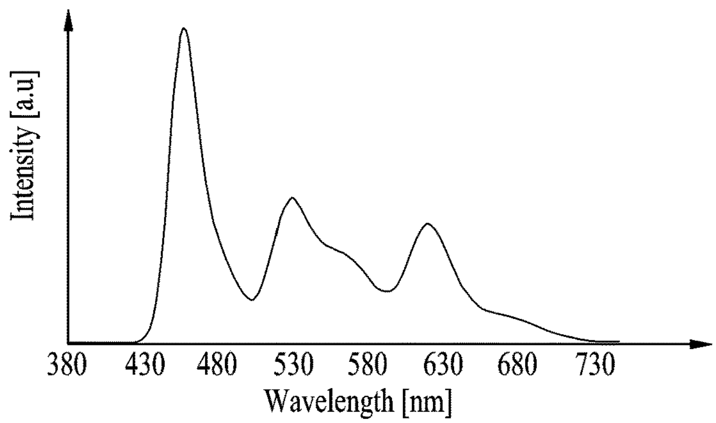
FIG. 19A is a graph illustrating intensity per wavelength for the first light emission portion of the second subpixel shown in FIG. 10.
Figure 19B:
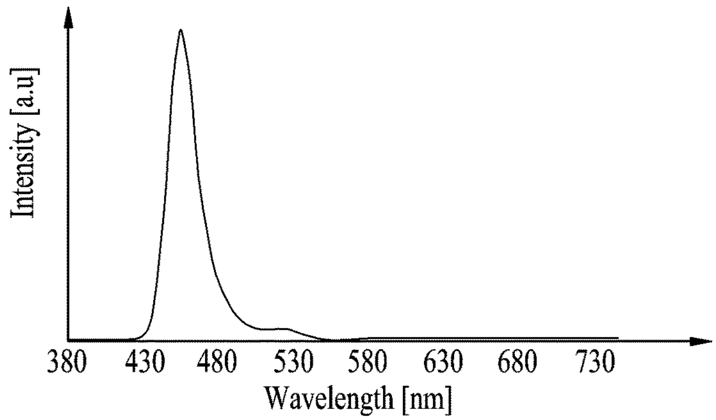
FIG. 19B is a graph illustrating intensity per wavelength for the second light emission portion of the second subpixel shown in FIG. 10.

FIG. 19A is a graph illustrating intensity per wavelength for the first light emission portion of the second subpixel shown in FIG. 10, and FIG. 19B is a graph illustrating intensity per wavelength for the second light emission portion of the second subpixel shown in FIG. 10. The second light emission portion of the second subpixel can include a blue color filter.

As seen on FIG. 19A, it is noted that light emitted from the first light emission portion of the second subpixel includes red, green and blue peak wavelengths. On the other hand, as seen on FIG. 19B, it is noted that light emitted from the first light emission portion of the second subpixel includes only a blue peak wavelength.

Figure 20:
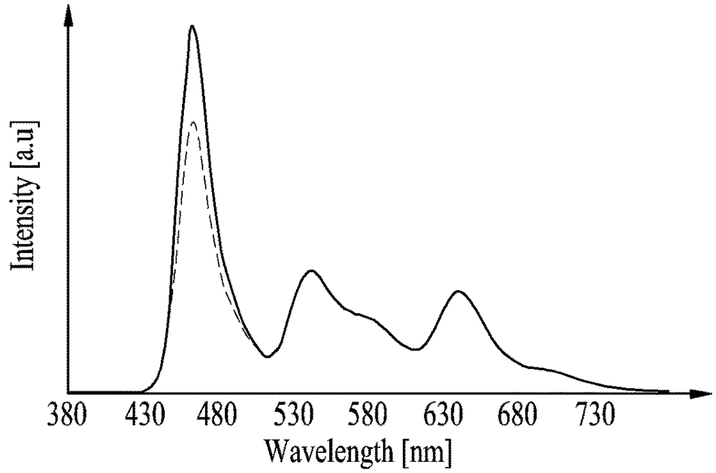
FIG. 20 is a graph illustrating intensity per wavelength for the second subpixel shown in FIG. 10 and a white subpixel according to a comparison example.

FIG. 20 is a graph illustrating intensity per wavelength for the second subpixel shown in FIG. 10 and a white subpixel according to a comparison example. In FIG. 20, a solid line denotes a light emission spectrum of the second subpixel shown in FIG. 10, and a dotted line denotes a light emission spectrum of the white subpixel according to the comparison example having one light emission portion.

As seen on FIG. 20, it is noted that the second subpixel according to the present disclosure has high intensity at a blue wavelength in comparison with the comparison example.

Therefore, the second subpixel according to the present disclosure has intensity increased at the blue wavelength by a light emission spectrum of each of the first light emission portion and the second light emission portion as shown in FIGS. 19A and 19B, whereby luminance and color temperature of the unit pixel can be increased. As a result, the light emitting display apparatus according to the present disclosure can improve luminance and a color temperature of a display image.

Figure 21A:
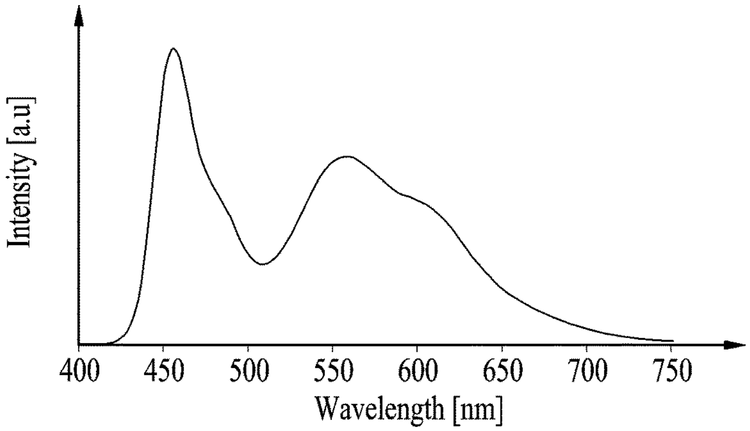
FIGS. 21A to 21C are graphs illustrating intensity per wavelength for the second subpixel according to first to third experimental examples of the present disclosure.
Figure 21B:
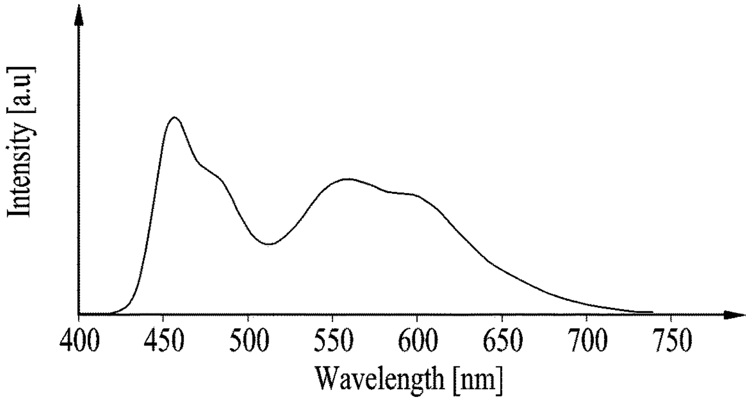
Figure 21C:
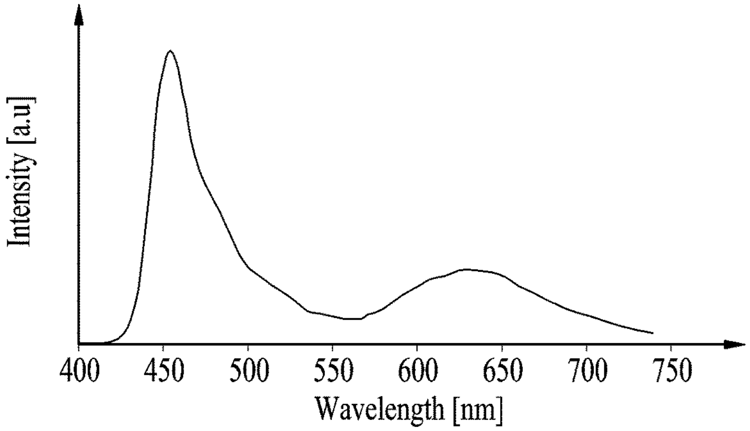

FIGS. 21A to 21C are graphs illustrating intensity per wavelength for the second subpixel according to first to third experimental examples of the present disclosure, wherein intensity per wavelength for the second subpixel is shown in accordance with a convex shape of the uneven pattern portion disposed in each of the first light emission portion and the second light emission portion of the second subpixel. In the first experimental example, the convex portion of the uneven pattern portion disposed in the second light emission portion and the convex portion of the uneven pattern portion disposed in the first light emission portion substantially have the same structure. In the second experimental example, the convex portion of the uneven pattern portion disposed in the second light emission portion has a height higher than that of the convex portion of the uneven pattern portion disposed in the first light emission portion as much as 1.5 times. In the third experimental example, the convex portion of the uneven pattern portion disposed in the second light emission portion has a height lower than that of the convex portion of the uneven pattern portion disposed in the first light emission portion as much as 0.5 times.

As seen on FIGS. 21A to 21C, it is noted that the color temperature of the second subpixel is different depending on the convex shape of the uneven pattern portion disposed in each of the first light emission portion and the second light emission portion of the second subpixel.

As seen on FIG. 21B, it is noted that each of red, green and blue peak wavelengths is reduced in the second experimental example, in which the convex portion of the uneven pattern portion disposed in the second light emission portion has a height higher than that of the convex portion of the uneven pattern portion disposed in the first light emission portion as much as 1.5 times, in comparison with the first experimental example. This second experimental example can be applied to embody a color temperature of 6500K.

As seen on FIG. 21C, it is noted that the blue peak wavelength is maintained but the red and green peak wavelengths are reduced in the third experimental example, in which the convex portion of the uneven pattern portion disposed in the second light emission portion has a height lower than that of the convex portion of the uneven pattern portion disposed in the first light emission portion as much as 0.5 times, in comparison with the first experimental example. This third experimental example can be applied to embody a color temperature of 10000K.

A light emitting display apparatus according to one or more embodiments of the present disclosure will be described below.

A light emitting display apparatus according to some embodiments of the present disclosure can include a substrate including a subpixel area having a non-light emission portion, a first light emission portion and a second light emission portion; a driving transistor disposed in the non-light emission portion of the subpixel area; an overcoat layer disposed on the substrate to overlay the driving transistor; first and second anode electrodes disposed to be spaced apart from each other on the overcoat layer of each of the first light emission portion and the second light emission portion and commonly connected to the driving transistor; a self-light emitting device on the first anode electrode and the second anode electrode; and a second electrode on the self-light emitting device, wherein the first light emission portion of the subpixel area and the second light emission portion of the subpixel area can have light extraction structures different from each other.

According to some embodiments of the present disclosure, the first light emission portion and the second light emission portion can have different sizes from each other.

According to some embodiments of the present disclosure, the first anode electrode can be configured to have a surface morphology different from the second anode electrode.

According to some embodiments of the present disclosure, the first light emission portion of the subpixel area can be configured to have a size greater than the second light emission portion of the subpixel area, and the overcoat layer can include an uneven pattern portion in the first light emission portion; and a non-pattern portion or a concave pattern portion in the second light emission portion.

According to some embodiments of the present disclosure, the overcoat layer can be configured to include the concave pattern portion in the second light emission portion, the uneven pattern portion can be configured to include a plurality of concave portions, the concave pattern portion can be configured to include a bottom surface and an inclined surface, and a distance between the substrate and the bottom surface of the concave pattern portion can shorter than a distance between the substrate and the concave portion.

According to some embodiments of the present disclosure, the first light emission portion of the subpixel area can be configured to have a size greater than the second light emission portion of the subpixel area, and the overcoat layer can be configured to include the uneven pattern portion in each of the first light emission portion and the second light emission portion.

According to some embodiments of the present disclosure, the uneven pattern portion in the first light emission portion can be configured to have a structure or a surface morphology different from the uneven pattern portion in the second light emission portion.

A light emitting display apparatus according to some embodiments of the present disclosure can further include a color filter in the second light emission portion of the subpixel area, or a color filter in the second light emission portion and a pattern layer between the substrate and the color filter.

According to some embodiments of the present disclosure, the color filter in the second light emission portion can a blue color filter or a red color filter.

A light emitting display apparatus according to some embodiments of the present disclosure can include a substrate having a unit pixel area; and a red subpixel, a white subpixel, a blue subpixel and a green subpixel disposed in the unit pixel area, the white subpixel having a light emission portion and a non-light emission portion, wherein the light emission portion of the white subpixel can include a first light emission portion and a second light emission portion spatially spaced apart from each other, and wherein the first light emission portion and the second light emission portion can have light extraction structures different from each other.

According to some embodiments of the present disclosure, the second light emission portion can be configured to have a size smaller than a size of the first light emission portion, and the first light emission portion can be configured to have a size greater than a light emission portion of each of the red subpixel, the blue subpixel and the green subpixel.

According to some embodiments of the present disclosure, each of the red subpixel, the blue subpixel and the green subpixel has a light emission portion and a non-light emission portion, the light emitting display apparatus can further include a light emitting device layer disposed on the light emission portion of each of the red subpixel, the white subpixel, the blue subpixel and the green subpixel, and wherein a surface morphology of the light emitting device layer disposed in the second light emission portion can different from the light emitting device layer disposed in the first light emission portion.

According to some embodiments of the present disclosure, each of the red subpixel, the blue subpixel and the green subpixel has a light emission portion and a non-light emission portion, the light emitting display apparatus can further include a light emitting device layer disposed in the light emission portion of each of the red subpixel, the white subpixel, the blue subpixel and the green subpixel, wherein the light emitting device layer disposed in the first light emission portion can be configured to have a surface morphology of an uneven shape, and wherein the light emitting device layer disposed in the second light emission portion can be configured to have any one surface morphology of a flat shape, a concave shape, and an uneven shape different from the light emitting device layer disposed in the first light emission portion.

According to some embodiments of the present disclosure, each of the red subpixel, the blue subpixel and the green subpixel has a light emission portion and a non-light emission portion, the light emitting display apparatus can further include an overcoat layer disposed in the light emission portion of each of the red subpixel, the white subpixel, the blue subpixel and the green subpixel, and wherein the overcoat layer can be configured to include an uneven pattern portion disposed in each of the light emission portion of the red subpixel, the light emission portion of the blue subpixel, the light emission portion of the green subpixel and the first light emission portion; and a non-pattern portion or a concave pattern portion disposed in the second light emission portion.

According to some embodiments of the present disclosure, the overcoat layer can be configured to include a concave pattern portion disposed in the second light emission portion, the uneven pattern portion can be configured to include a plurality of concave portions, the concave pattern portion can be configured to include a bottom surface and an inclined surface, and a distance between the substrate and the bottom surface of the concave pattern portion can shorter than the substrate and the concave portion.

According to some embodiments of the present disclosure, each of the red subpixel, the blue subpixel and the green subpixel has a light emission portion and a non-light emission portion, the light emitting display apparatus can further include an overcoat layer having an uneven pattern portion disposed in the light emission portion of each of the red subpixel, the white subpixel, the blue subpixel and the green subpixel, wherein the uneven pattern portion disposed in the light emission portion of each of the red subpixel, the white subpixel, the blue subpixel and the green subpixel can be configured to have a structure or surface morphology different from each other.

According to some embodiments of the present disclosure, each of the red subpixel, the blue subpixel and the green subpixel has a light emission portion and a non-light emission portion, the light emitting display apparatus can further include an overcoat layer having an uneven pattern portion disposed in the light emission portion of each of the red subpixel, the white subpixel, the blue subpixel and the green subpixel, wherein the uneven pattern portion disposed in the first light emission portion can be configured to have a structure or surface morphology different from the uneven pattern portion disposed in the second light emission portion.

According to some embodiments of the present disclosure, the white subpixel can be configured to further include a color filter in the second light emission portion, or a pattern layer in the second light emission portion and a color filter on the pattern layer.

According to some embodiments of the present disclosure, the color filter disposed in the second light emission portion can a blue color filter or a red color filter.

According to some embodiments of the present disclosure, the uneven pattern portion can be configured to include a plurality of convex portions, and the convex portion of the uneven pattern portion disposed in the first light emission portion can be configured to have a structure different from the convex portion of the uneven pattern portion disposed in the second light emission portion.

According to some embodiments of the present disclosure, the uneven pattern portion can be configured to include a plurality of convex portions, the convex portion disposed in the second light emission portion can be configured to have a bottom diameter greater than the convex portion disposed in the first light emission portion as much as approximately 0.5 to 1.5 times, or configured to have a height higher than the convex portion disposed in the first light emission portion as much as approximately 0.5 to 1.5 times.

According to some embodiments of the present disclosure, the uneven pattern portion can be configured to include a plurality of concave portions, and the number of the concave portions disposed in the second light emission portion can more than or smaller than the number of the concave portions disposed in the first light emission portion.

The light emitting display apparatus according to an embodiment of the present disclosure can be applied to various applications. The light emitting display apparatus according to an embodiment of the present disclosure can be applied to mobile devices, video phones, smart watches, watch phones, wearable devices, foldable devices, rollable devices, bendable devices, flexible devices, curved devices, electronic organizers, electronic book, portable multimedia players (PMPs), personal digital assistants (PDAs), MP3 players, mobile medical devices, desktop personal computers (PCs), laptop PCs, netbook computers, workstations, navigation apparatuses, automotive navigation apparatuses, automotive display apparatuses, TVs, wall paper display apparatuses, signage apparatuses, game machines, notebook computers, monitors, cameras, camcorders, home appliances, etc.

The above-described features, structures, and effects of the present disclosure are included in at least one embodiment of the present disclosure, but are not limited to only one embodiment. Furthermore, the features, structures, and effects described in at least one embodiment of the present disclosure can be implemented through combination or modification of other embodiments by those skilled in the art. Therefore, content associated with the combination and modification should be construed as being within the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A light emitting display apparatus comprising:

a substrate having a unit pixel area; and a red subpixel, a white subpixel, a blue subpixel and a green subpixel disposed in the unit pixel area, the white subpixel having light emission portions and a non-light emission portion, wherein the light emission portions of the white subpixel include a first light emission portion and a second light emission portion spatially spaced apart from each other, wherein the first light emission portion and the second light emission portion are configured to have different sizes from each other, wherein the first light emission portion and the second light emission portion of the white subpixel have light extraction structures different from each other, wherein the white subpixel further includes an auxiliary color filter disposed in the second light emission portion, wherein the first light emission portion lacks the auxiliary color filter, and wherein the auxiliary color filter extends continuously from the second light emission portion into the non-light emission portion to overlap with a color filter of an adjacent subpixel to form a light-shielding layer.

2. The light emitting display apparatus of claim 1, wherein the second light emission portion is configured to have a size smaller than a size of the first light emission portion.

3. The light emitting display apparatus of claim 2, wherein the first light emission portion is configured to have a size greater than a light emission portion of each of the red subpixel, the blue subpixel and the green subpixel.

4. The light emitting display apparatus of claim 1, wherein the first light emission portion and the second light emission portion are configured to include a plurality of concave portions, and wherein the number of the concave portions disposed in the second light emission portion is different from the number of the concave portions disposed in the first light emission portion.

5. The light emitting display apparatus of claim 4, wherein the number of the concave portions disposed in the second light emission portion is more than or smaller than the number of the concave portions disposed in the first light emission portion.

6. The light emitting display apparatus of claim 1, wherein the first light emission portion and the second light emission portion are configured to include a plurality of convex portions, and wherein each of the plurality convex portions disposed in the second light emission portion is configured to have a different bottom diameter from each of the plurality convex portions disposed in the first light emission portion, or configured to have a different height from each of the plurality of convex portions disposed in the first light emission portion.

7. The light emitting display apparatus of claim 6, wherein each of the plurality convex portions disposed in the second light emission portion is configured to have a bottom diameter greater than each of the plurality convex portions disposed in the first light emission portion as much as approximately 0.5 to 1.5 times, or configured to have a height higher than each of the plurality of convex portions disposed in the first light emission portion as much as approximately 0.5 to 1.5 times.

8. The light emitting display apparatus of claim 1, wherein each of the red subpixel, the blue subpixel and the green subpixel has the light emission portion and a non-light emission portion, wherein the light emitting display apparatus further comprises a light emitting device layer disposed on the light emission portion of each of the red subpixel, the white subpixel, the blue subpixel and the green subpixel, and wherein a surface morphology of the light emitting device layer disposed in the second light emission portion is different from the light emitting device layer disposed in the first light emission portion.

9. The light emitting display apparatus of claim 1, wherein each of the red subpixel, the blue subpixel and the green subpixel has the light emission portion and a non-light emission portion, wherein the light emitting display apparatus further comprises a light emitting device layer disposed in the light emission portion of each of the red subpixel, the white subpixel, the blue subpixel and the green subpixel, and wherein the light emitting device layer disposed in the first light emission portion is configured to have a surface morphology of an uneven shape.

10. The light emitting display apparatus of claim 9, wherein the light emitting device layer disposed in the second light emission portion is configured to have any one surface morphology of a flat shape, a concave shape, and an uneven shape different from the light emitting device layer disposed in the first light emission portion.

11. The light emitting display apparatus of claim 1, wherein each of the red subpixel, the blue subpixel and the green subpixel has the light emission portion and anon-light emission portion, wherein the light emitting display apparatus further comprises an overcoat layer disposed in the light emission portion of each of the red subpixel, the white subpixel, the blue subpixel and the green subpixel, and wherein the overcoat layer is configured to include an uneven pattern portion disposed in each of the light emission portion of the red subpixel, the light emission portion of the blue subpixel, the light emission portion of the green subpixel and the first light emission portion.

12. The light emitting display apparatus of claim 11, wherein the overcoat layer is configured to further include a non-pattern portion or a concave pattern portion disposed in the second light emission portion.

13. The light emitting display apparatus of claim 12, wherein:

the overcoat layer is configured to further include a concave pattern portion disposed in the second light emission portion, the uneven pattern portion is configured to include a plurality of concave portions, the concave pattern portion is configured to include a bottom surface and an inclined surface, and a distance between the substrate and the bottom surface of the concave pattern portion is shorter than the substrate and each of the plurality of concave portions.

14. The light emitting display apparatus of claim 1, wherein each of the red subpixel, the blue subpixel and the green subpixel has the light emission portion and anon-light emission portion, wherein the light emitting display apparatus further comprises an overcoat layer having an uneven pattern portion disposed in the light emission portion of each of the red subpixel, the white subpixel, the blue subpixel and the green subpixel, and wherein the uneven pattern portion disposed in the light emission portion of each of the red subpixel, the white subpixel, the blue subpixel and the green subpixel is configured to have a structure or surface morphology different from each other.

15. The light emitting display apparatus of claim 1, wherein the auxiliary color filter is a blue color filter or a red color filter.

16. The light emitting display apparatus of claim 1, wherein each of the red subpixel, the blue subpixel and the green subpixel has the light emission portion and a non-light emission portion, wherein the light emitting display apparatus further comprises an overcoat layer having an uneven pattern portion disposed in the light emission portion of each of the red subpixel, the white subpixel, the blue subpixel and the green subpixel, wherein the uneven pattern portion disposed in the first light emission portion is configured to have a structure or surface morphology different from the uneven pattern portion disposed in the second light emission portion.

17. The light emitting display apparatus of claim 16, wherein:

the uneven pattern portion is configured to include a plurality of convex portions, and the plurality of convex portions of the uneven pattern portion disposed in the first light emission portion is configured to have a structure different from the plurality of convex portions of the uneven pattern portion disposed in the second light emission portion.

18. The light emitting display apparatus of claim 16, wherein:

the uneven pattern portion is configured to include a plurality of convex portions, each of the plurality of convex portions disposed in the second light emission portion is configured to have a bottom diameter greater than each of the plurality of convex portions disposed in the first light emission portion as much as approximately 0.5 to 1.5 times, or configured to have a height higher than each of the plurality of convex portions disposed in the first light emission portion as much as approximately 0.5 to 1.5 times.

19. The light emitting display apparatus of claim 16, wherein:

the uneven pattern portion is configured to include a plurality of concave portions, and the number of the concave portions disposed in the second light emission portion is more than or smaller than the number of the concave portions disposed in the first light emission portion.

20. The light emitting display apparatus of claim 1, further comprising a bank layer disposed in the non-light emission portion, the bank layer defining an emission area of the first light emission portion and an emission area of the second light emission portion, wherein the light-shielding layer formed by an overlap of the auxiliary color filter and the color filter of the adjacent subpixel is disposed between the substrate and the bank layer.

* * * * *